US 7,159,198 B1

(12) United States Patent
Ip et al.

(10) Patent No.: US 7,159,198 B1
(45) Date of Patent: Jan. 2, 2007

(54) SYSTEM AND METHOD FOR IDENTIFYING DESIGN EFFICIENCY AND EFFECTIVENESS PARAMETERS FOR VERIFYING PROPERTIES OF A CIRCUIT MODEL

(75) Inventors: Chung-Wah Norris Ip, Fremont, CA (US); Lawrence Loh, Milpitas, CA (US); Vigyan Singhal, Fremont, CA (US); Howard Wong-Toi, Albany, CA (US); Soe Myint, Santa Clara, CA (US)

(73) Assignee: Jasper Design Automation, Mountain View, CA (US)

( * ) Notice: Subject to any disclaimer, the term of this patent is extended or adjusted under 35 U.S.C. 154(b) by 282 days.

(21) Appl. No.: 10/745,993

(22) Filed: Dec. 24, 2003

Related U.S. Application Data

(63) Continuation-in-part of application No. 10/389,316, filed on Mar. 14, 2003.

(60) Provisional application No. 60/377,392, filed on May 3, 2002.

(51) Int. Cl.
G06F 17/50 (2006.01)

(52) U.S. Cl. ..................... 716/5; 716/4; 716/6

(58) Field of Classification Search ................ 716/4–6
See application file for complete search history.

(56) References Cited

U.S. PATENT DOCUMENTS

| 6,102,959 A | 8/2000 | Hardin et al. |
| 6,185,516 B1 | 2/2001 | Hardin et al. |
| 6,594,804 B1 | 7/2003 | Hojati |
| 6,609,229 B1 * | 8/2003 | Ly et al. ................. 716/4 |
| 6,651,228 B1 * | 11/2003 | Narain et al. ............. 716/5 |
| 6,725,431 B1 | 4/2004 | Yang |
| 6,772,402 B1 * | 8/2004 | Mortensen ............... 716/5 |
| 2004/0123254 A1 | 6/2004 | Geist et al. |

OTHER PUBLICATIONS

Beer, I. et al., "RuleBase: An Industry-Oriented Formal Verification Tool," 33rd Design Automation Conference, DAC 1996.

* cited by examiner

*Primary Examiner*—Vuthe Siek
(74) *Attorney, Agent, or Firm*—Fenwick & West LLP

(57) ABSTRACT

The present invention is directed to a system and a method for verifying properties of a circuit model while providing information to help the user manually modify a design analysis region and/or environmental constraints. While conventional systems attempt to substantially automate the entire formal verification process, the present invention iteratively provides information to the user about the cost and effect of changes to the environmental constraints and the analysis region. This information enables the user to weigh the effectiveness and efficiency of one or more modifications to the design analysis area and/or to the environmental constraints (assumptions). The information provided to the user can help a user compare a variety of alternative modifications in order to select the modifications that are efficient and effective. In addition, the information can provide alternatives along with the cost and effect of each alternative to the user who otherwise did not identify these alternatives, thus the invention can help the user by identifying suggestions that the user may not have otherwise considered. The present invention then receives information from the user to modify the design analysis area and/or the environmental constraints and will analyze the design with these modified parameters.

66 Claims, 17 Drawing Sheets

| DATABASE ID | OBJECT TYPE | OBJECT INPUTS | NAME |
|---|---|---|---|
| 0 | INPUT | NONE | IN_0 |
| 1 | INPUT | NONE | CLK |
| 2 | INPUT | NONE | IN_1 |
| 3 | REGISTER | 0,1 | Q_0 |
| 4 | REGISTER | 2,1 | Q_1 |
| 5 | BUFFER | 3 | X_0 |
| 6 | INVERTER | 3 | X_1 |
| 7 | BUFFER | 4 | X_2 |
| 8 | INVERTER | 4 | X_3 |
| 9 | AND | 5,7 | OUT_0 |
| 10 | AND | 6,7 | OUT_1 |
| 11 | AND | 5,8 | OUT_2 |
| 12 | AND | 6,8 | OUT_3 |

PROPERTY: (OUT_0&(!OUT_1)&(!OUT_2)&(!OUT_3))|
(OUT_1&(!OUT_0)&(!OUT_2)&(!OUT_3))|
(OUT_2&(!OUT_0)&(!OUT_1)&(!OUT_3))|
(OUT_3&(!OUT_0)&(!OUT_1)&(!OUT_2))

FIG. 6

SYSTEM AND METHOD FOR IDENTIFYING DESIGN EFFICIENCY AND EFFECTIVENESS PARAMETERS FOR VERIFYING PROPERTIES OF A CIRCUIT MODEL

RELATED APPLICATIONS

This application is a continuation-in-part of U.S. patent application Ser. No. 10/389,316, filed on Mar. 14, 2003 by Vigyan Singhal and Joseph E. Higgins, which claims priority to U.S. provisional application No. 60/377,392, filed on May 3, 2002 by Vigyan Singhal and Joseph E. Higgins which are incorporated by reference herein in their entirety.

This application is also related to U.S. patent application Ser. No. 10/736,826 filed on Dec. 15, 2003 by Chung-Wah Norris Ip, Lawrence Loh, Vigyan Singhal, and Howard Wong-Toi, entitled "Managing Formal Verification Complexity of Designs with Counters" and U.S. patent application Ser. No. 10/606,419 filed on Jun. 26, 2003 by Chung-Wah Norris Ip, Vigyan Singhal, Joseph E. Higgins, and Howard Wong-Toi, and U.S. patent application Ser. No. 10/401,315, filed on Mar. 27, 2003 by Vigyan Singhal, Joseph E. Higgins, and Alok N. Singh, which are all incorporated by reference herein in their entirety.

BACKGROUND

The present invention relates generally to the field of functional verification of digital circuit designs. More specifically, the present invention relates to the field of formal verification of a digital circuit design and verifying the behavior of a circuit model to satisfy specified properties.

Recent increases in the complexity of modern integrated circuits have exacerbated the difficulty of verifying design correctness. The verification phase of a typical integrated circuit design project consumes approximately 70–80% of the total time and resources dedicated to a project. Flaws in the design that are not found during the verification phase have significant economic impact in terms of increased time-to-market and reduced profit margins.

A typical design flow for integrated circuit design includes many steps that proceed sequentially, with each step depending on the results of the previous steps. Consequently, when a flaw is discovered in a step, all the previous steps must be repeated, often at a significant cost. Hence, it is highly desirable to find and fix design flaws as early as possible in a design flow.

Traditionally, simulation-based techniques have been used to verify design correctness. Transistor-level simulation based techniques were used in the early 1970s and logic gate-level simulation based techniques were used in the late 1980s. As the complexity of designs increased with the passage of time, drawbacks associated with these techniques came into light. These techniques became less effective because of their inability to completely and quickly verify large designs. A popular alternative is the use of Register Transfer Language (RTL)-level simulation. Contemporary verification and debugging tools use various levels of abstractions for defining design specifications. These abstractions are expressed in high-level description languages. High-level description languages provide a number of functionalities for analyzing and verifying a design while performing simulation. For example, a designer can navigate the design hierarchy, view the RTL source code, and set breakpoints on a statement of an RTL source code to stop the simulation. Also, line numbers are provided in the RTL source code to identify different lines and statements. Further, the verification and debugging tools often support viewing and tracing variables and some times even signal values. These RTL-level simulation tools typically also offer these and other types of RTL debugging functionalities.

The verification tools as mentioned above typically follow a design flow. In the first step of the design flow, the conceptual nature of the integrated circuit is determined. The desired functionality of a circuit is expressed as a collection of properties or specifications, and possibly as a model of the behavior in a high-level language such as C++. The RTL model of the digital circuit is built based upon knowledge of the specifications or the high-level model. The RTL model is expressed in a hardware description language (HDL) such as Verilog available from Cadence Design Systems, Inc. of Santa Clara, Calif. or VHDL available from IEEE of New York, N.Y. Many other steps such as synthesis, timing optimization, clock tree insertion, place and route, etc., yield subsequent transformations of the design. These transformations eventually result in a set of masks that are fabricated into integrated circuits. The current invention is targeted at finding design flaws in the RTL model of the design, which is a very early phase of the design flow.

In the design flow, creation of RTL source code is followed by verification in order to check the compliance of the RTL source code to the design specifications. Three approaches commonly used to verify the design at the RTL level are simulation, emulation and formal methods.

Simulation is one of the most prevalent methods used to determine whether the design is in accordance with the specifications by simulating the behavior of the RTL model. The simulation process uses RTL source code and a "Test Bench" to verify a design. The Test Bench contains a subset of all possible inputs to the circuit/logic. For an 'n' input circuit, there are $2^n$ possible inputs at any given time. For large n, e.g., for a complex design, the number of possible input sequences becomes prohibitively large. To simplify this, only a subset of all possible input sequences is described in any given Test Bench. An example of such a tool is NC-Verilog from Cadence Design Systems, Inc. of Santa Clara, Calif. To simulate the RTL model, a Test Bench must be created to provide appropriate input stimulus to the RTL model. Creating the Test Bench is a time consuming process. The process of simulating the Test Bench is also time consuming. Furthermore, it is effectively impossible to create enough test cases to completely verify that the specified properties of the design are true. This is because of the sheer number of possible input sequences, and also because it requires in-depth knowledge and tremendous creativity on the part of the Test Bench creator to imagine the worst-case scenarios.

An increasingly popular alternative is to use formal methods to completely verify properties of a design. Formal methods use mathematical techniques to prove that a design property is either always true, or to provide an example scenario (referred to as a counterexample) demonstrating that the property is false. One category of tools using formal methods to verify properties are known as Model Checkers. An example of a conventional model checking tool is the Formal-Check tool from Cadence Design Systems, Inc. of Santa Clara, Calif.

FIG. 1 shows an example of a property 120 and an environmental constraint 118 that could be applied to a circuit model 100. Property 120 specifies the behavior of the output signals (OUT_0 110, OUT_1 112, PREV_OUT_0 114, PREV_OUT_1 116). Environmental constraint 118 is a boolean expression that specifies constraint on the input signals (X_0 102, X_1 104, X_2 106), as described in greater detail below.

When the conventional method is applied to verify the property of a circuit model, there are three possible outcomes: (1) The system determines that the property is true for all input sequences that satisfy the set of environmental constraints. (2) The system is unable to make a determination due to lack of computing resource (time or memory). (3) The system determines that the property is false. In the latter case, the conventional system produces a counterexample that satisfies the set of environmental constraints, but for which the property fails to be true.

Several issues inhibit the widespread use of model checking. One issue is performance. Resources used to perform verification are typically exponentially related to the number of registers in the circuit model. This is referred to as the "state space explosion" problem. Many conventional Model Checkers analyze the entire design before proving a particular property. The complexity and size of modern integrated circuits, combined with the state space explosion problem, make it impossible to use such Model Checkers on large designs.

Instead of analyzing the entire design, other conventional Model Checkers analyze the portion of the design relevant to a particular property from a structural point of view. This includes all portions of the design between the signals relevant to the property and the primary inputs. An example of a conventional system that implements this property-dependent design analysis is the COSPAN model checking engine referred to in R. P. Kurshan, "Formal Verification in a Commercial Setting", Design Automation Conference, pp. 258–262, June 1997, Anaheim, Calif. However, even the property-relevant portion of the design can be very large. Thus, in this case the state space explosion problem can result in severe performance problems.

Another issue is that no conventional system permits complete control over the region of the circuit model to be examined when verifying a particular property. The user typically resorts to manually modifying the design by removing and replacing parts of the design in order to determine if a property is true. An example of this design modification technique is described in S. G. Govindaraju et al., "Counterexample-Guided Choice of Projections in Approximate Symbolic Model Checking", IEEE International Conference on Computer-Aided Design, pp. 115–119, November 2000. This modification of the design introduces the possibility of human error and requires additional steps.

Conventional formal verification techniques attempt to fully automate the formal verification process, and the primary flow usually does not involve getting inputs from the user. The primary interaction from the user is for the user to provide appropriate environmental constraints. However, a user that is used to running simulation may not know how to provide environmental constraints for a formal tool, and there may be a wide range of possible assumptions, some lead to an efficient formal analysis, some lead to incomplete proof.

In addition, even if the user has a chance to provide detailed guidance to the formal verification process, a user that is not an expert in formal verification may not know enough about the formal verification algorithm to provide the right inputs to the tool. Furthermore, at each interactive step, there may be a wide range of possible actions; without generating guidance from the tool for the user, the user may specify actions that have adverse effect to the performance of the formal verification process.

Accordingly, what is needed is a system and a method that (1) verifies a circuit model in a short duration of time, (2) automatically verifies a circuit model while permitting complete control over the region of the circuit model to be examined and environmental conditions to be applied, and (3) provides the user with information to evaluate the cost and effect of modifying the region of the circuit model to be examined and/or adding the environmental constraints (assumptions) to be applied.

SUMMARY

The present invention is directed to a system and a method for verifying properties of a circuit model while providing information to help the user manually modify a design analysis region and/or environmental constraints. While conventional systems attempt to substantially automate the entire formal verification process, the present invention iteratively provides information to the user about the cost and effect of changes to the environmental constraints and the analysis region. This information enables the user to weigh the effectiveness and efficiency of one or more modifications to the design analysis area and/or to the environmental constraints (assumptions). The information provided to the user can help a user compare a variety of alternative modifications in order to select the modifications that are efficient and effective. In addition, the information can provide alternatives along with the cost and effect of each alternative to the user who otherwise did not identify these alternatives, thus the invention can help the user by identifying suggestions that the user may not have otherwise considered. The present invention then receives information from the user to modify the design analysis area and/or the environmental constraints and will analyze the design with these modified parameters.

In one embodiment, the present invention analyzes the design and if the design is verified, the invention enables the user to modify environmental constraints and/or analysis regions to increase the speed of the verification process. The present invention quickly provides the user with a list of possible modifications, e.g., environmental constraints and/or changes to the analysis region, along with information about the cost or complexity of these modifications. In addition the present invention can provide the user with an indication of the effect that implementing each of the modifications has on the verification process, e.g., does the modification generate a counterexample or does it reintroduce a previously identified counterexample.

When one or more counterexamples are generated during the design analysis, the present invention can quickly provide the user with a list of possible modifications, e.g., environmental constraints and/or changes to the analysis region, along with information about the cost or complexity of implementing these modifications. In addition the present invention can iteratively provide the user with an indication of the effect that implementing each of the modifications has on the verification process, e.g., does it eliminate a counterexample or reintroduce a previously removed counterexample. By providing this information to the user both at the start and iteratively during the verification process, the present invention is able to receive information from the user that may significantly improve the performance of the system by guiding the user to provide a better design analysis configuration. For example, the user may modify environmental constraints that eliminate some counterexamples or increase the efficiency of the analysis. Similarly, the user may modify the analysis region by expanding or contracting the region in order to eliminate counterexamples and/or to increase the efficiency of the analysis.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 4 is a data structure in tabular form representing the circuit model of FIG. 3.

FIG. 6 shows a property, in textual form, whose validity is affected by different choices of the set of boundary nets

DESCRIPTION OF PREFERRED EMBODIMENTS

Figure 1:
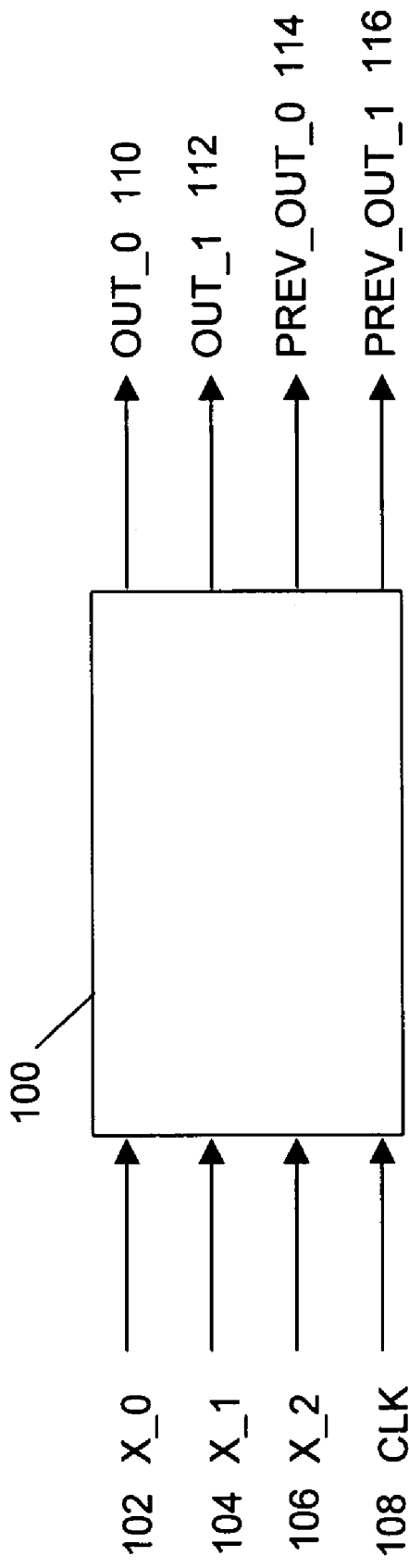
FIG. 1 is a block diagram depicting an example of a circuit model, an environmental constraint applied on the circuit model input and a desired property that the circuit model should satisfy.

A preferred embodiment of the present invention is now described with reference to the figures where like reference numbers indicate identical or functionally similar elements. Also in the figures, the left most digits of each reference number corresponds to the figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

The present invention provides a method and a system for verification of RTL-level circuit models using formal methods. For the purpose of clarity, the terms used for describing the present invention are defined below.

The term "formula" describes a boolean formula consisting of signals and operators in a circuit model. Examples of operators are AND, OR, NOT and other operators related to time. An example of an operator related to time is one that refers to the previous value of a signal. Such operators are well known in the art such as that described in K. McMillan, "Symbolic Model Checking", PhD. thesis, Carnegie Mellon University, May 1992. The formula can have either a true (1), or a false (0) value.

The term "property" defines a desirable behavior of the circuit model in terms of a formula. The user wishes to check if a property is true or false in the context of a circuit model. FIG. 1 shows an example of a property 120 for a circuit model 100. Signals X_0 102, X_104, X_2 106 and CLK 108 are received by circuit model 100. Signals OUT_0 110, OUT_1 112, PREV_OUT_0 114 and PREV_OUT_1 116 are output from circuit model 100. Signals PREV_OUT_0 114 and PREV_OUT_1 116 represent the values of signals OUT_0 110 and OUT_1 112 delayed by one clock cycle. Property 120 requires that if signals (OUT_0 110, OUT_1 112) at the previous clock cycle is not (0,0), then their current values cannot have the value (1,0).

The term "environmental constraint" describes a constraint on the primary inputs of a circuit model in terms of a formula. The term "environmental constraint" is also referred to as "assumption". A property is verified in the context of a set of environmental constraints, all the environmental constraints being true in the circuit model. The set of environmental constraints may be a null set (i.e. no environmental constraints) or may comprise one or more environmental constraints. Referring again to FIG. 1, property 120 is checked whether it is true or false by assuming that an environmental constraint 118 is true. Environmental constraint 118 specifies that inputs (X_0 102, X_1 104, X_2 106) may only take values (0, 0, 1), (0, 1, 0) or (1, 0, 0) when proving property 120 of circuit model 100.

Figure 3:
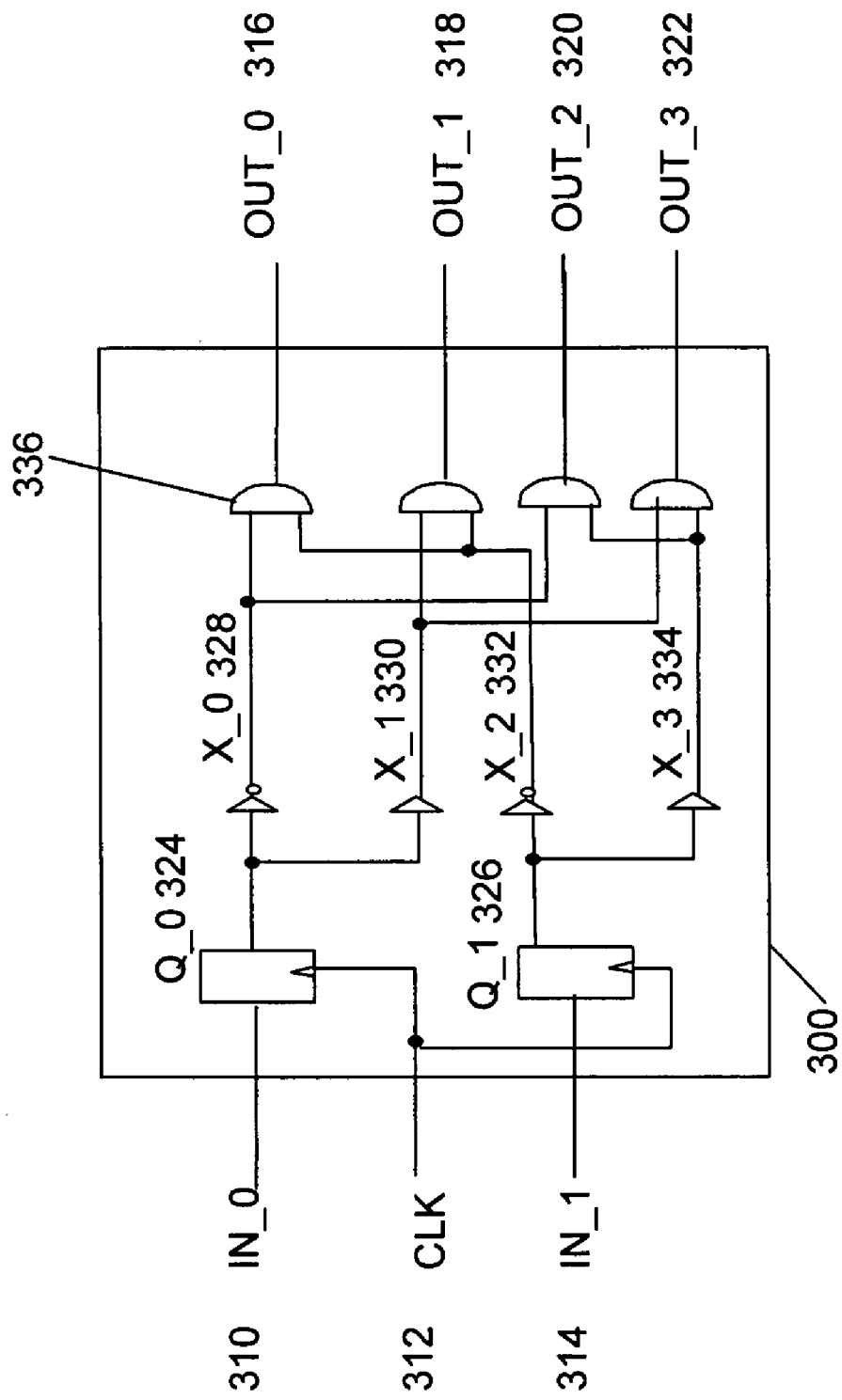
FIG. 3 is a circuit diagram depicting examples of several possible complete sets of boundary nets for a circuit model.

The term "boundary net" describes either a primary input or a signal that is used to remove a portion of the design from the formal analysis. During formal analysis, instead of having values as determined by the logic in the design, these boundary nets can take any value unless constrained by an assumption. As a result, the tool is analyzing more behavior than is possible in the actual design, and any property that is verified as "always true" using the set of boundary nets is also "always true" in the original design. For example in FIG. 3, a property may refer to signals OUT_0 316, OUT_1 318, OUT_2 320 and OUT_3 322. Three possible sets of boundary nets for this property are (1) Q_0 324 and Q_1 326, or (2) X_0 328, X_1 330, X_2 332 and X_3 334, or (3) IN_0 310, CLK 312 and IN_1 314.

Figure 5:
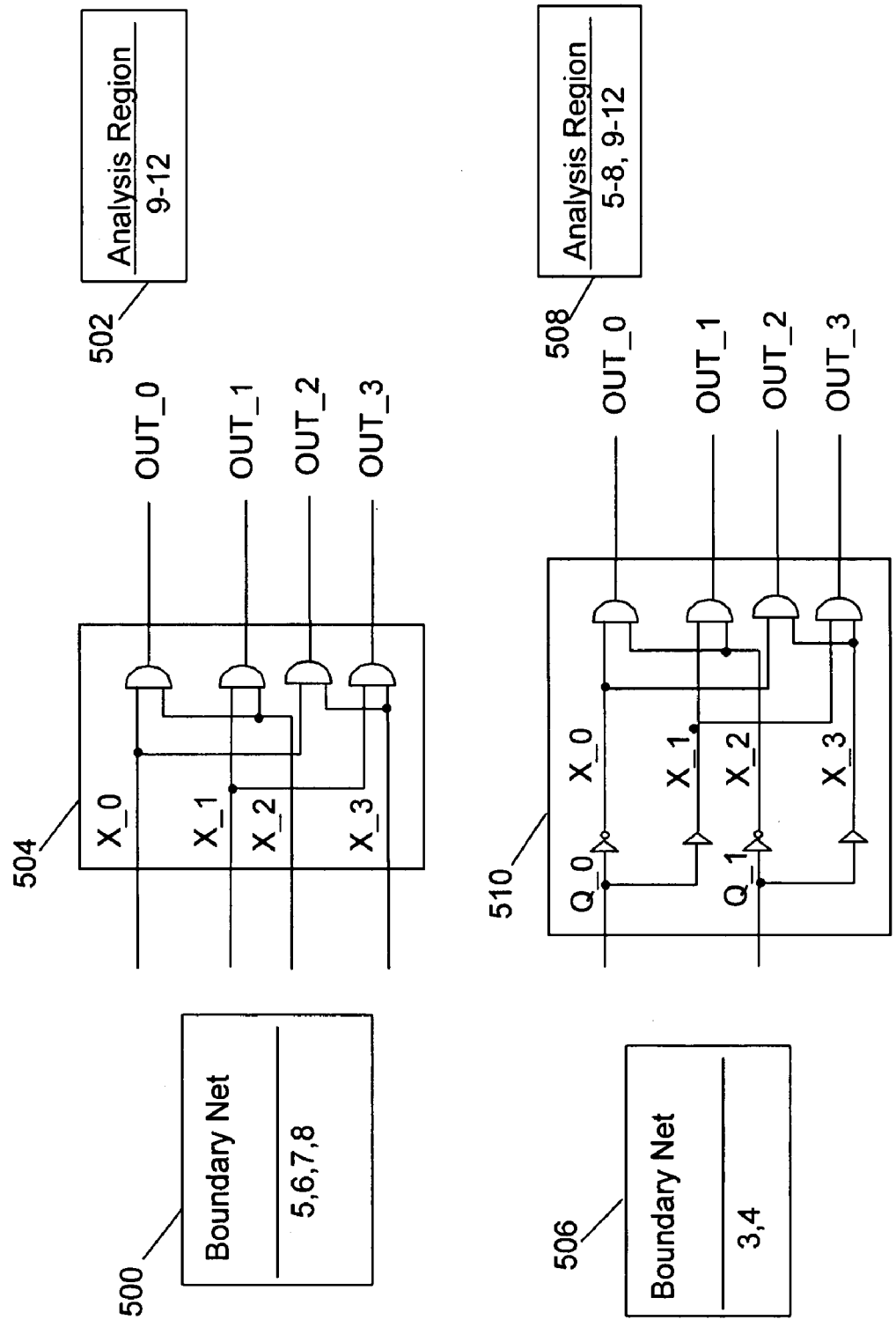
FIG. 5 shows two different complete sets of boundary nets for circuit model of FIG. 3.

The term "analysis region" comprises the following signals: (1) all signals referred to by a property (and the assumptions), (2) all signals in the corresponding set of boundary nets, and (3) all signals that lie on a signal path between a signal referred to by a property (and assumptions) and a signal in the set of boundary nets. A set of boundary nets is called complete if the signals in the analysis region are not connected to signals outside of the region except through a boundary net. An analysis region corresponds to a particular complete set of boundary nets, and similarly, a complete set of boundary nets defines a corresponding analysis region. Hence, the two terms are herein used interchangeably in the description. FIG. 5, described below, shows the correspondence between a set of boundary nets and an analysis region. Given a property referring to signals OUT_0 316, OUT_1 318, OUT_2 320, the set of boundary nets 500 corresponds to analysis region 502 and vice versa. Similarly the set of boundary nets 506 corresponds to analysis region 508 and vice versa.

Figure 2:
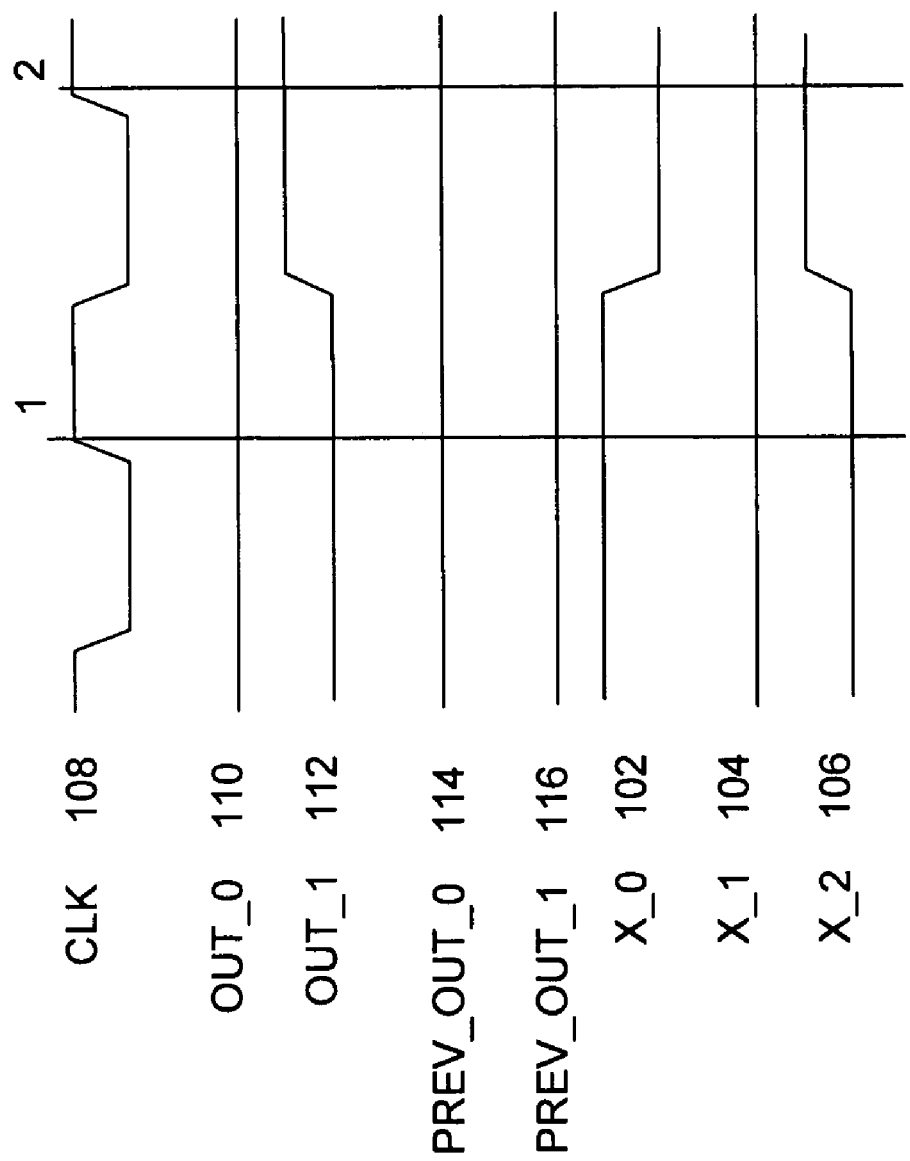
FIG. 2 is a timing diagram depicting an example sequence of input values that cause the circuit model to violate the desired property. The figure also shows the consequent output values.

The term 'counterexample' describes a scenario illustrating how the property may have a false value. Traditionally, a counterexample is a sequence of value assignments to the primary inputs of the design. With U.S. application Ser. No. 10/389,316, referenced above, and other similar approaches using the concept of analysis region, it can be a sequence of value assignments to the boundary nets. The scenario must satisfy the set of environmental constraints. FIG. 2 provides a counterexample for property 120 in FIG. 1. Values of input signals X_0 102, X_1 104 and X_2 106 as shown in FIG. 2 satisfy environmental constraint 118. Property 120 becomes false (0) for the values of signals PREV_OUT_0 114, PREV_OUT_1 116, OUT_0 110 and OUT_1 112 as indicated in FIG. 2.

The term "false negative" describes a scenario when a property is determined to be false and yet the user considers the scenario to be irrelevant. It may be because it requires an illegal value sequence at the primary inputs, in which case the user needs to add a new environment constraint for the formal analysis. On the other hand, it may be because, while the property is false only in the context of the current set of boundary nets, but not in the context of the full design. In this case, the user needs to modify the boundary nets for the formal analysis.

An example of a false negative is shown in FIGS. 4–6. A set of boundary nets is represented as a collection of database identifiers as illustrated in FIG. 4. For example, the set of boundary nets 500 refers to signals X_0 328, X_1 330, X_2 332 and X_3 334 in FIG. 3. With this choice of the set of boundary nets 500, circuit model 504 represents the portion in circuit model 300 on which the property is formally analyzed. Another example shows the set of boundary nets 506, which refers to signals Q_0 324 and Q_1 326. With this choice of the set of boundary nets 506, circuit model 510 represents the portion in circuit model 300 on which the property is formally analyzed. FIG. 5 also illustrates the methodology of choosing the set of boundary nets to check a property 600. For example, assume that the user wishes to check property 600 of FIG. 6 in context of circuit model 300. If the set of boundary nets 500 of FIG. 5 is chosen, then property 600 is false. This is because the assignment X_0=0, X_1=0, X_2=0 and X_3=0 results in property 600 having a false value. However, if the set of boundary nets is expanded to 506 of FIG. 5, then property 600 is true. This is because any choice of values for Q_0 324 and Q_1 326 results in property 600 having the true value. Thus, property 600 can be determined to be true without entirely examining circuit model 300. The false property value computed in context of the set of boundary nets 500 is a false negative. This is because property 600 is true for another choice of the set of boundary nets 506.

The term "boolean decision diagram" (BDD) refers to a graph-based data structure used for manipulating boolean functions. A description of the techniques used to create and manipulate BDDs may be found in R. E. Bryant, "Graph-Based Algorithms for boolean Function Manipulation", IEEE Transactions on Computers, Vol. C-35, No. 8, August 1986, pp. 677–691.

The term "design hierarchy" describes a collection of sub-designs and the manner in which they are interconnected. The design hierarchy has exactly one top-level design. The top-level design is further subdivided into sub-designs. A sub-design can be encapsulated into a single unit and repeatedly instantiated inside other designs.

The term "bus" describes a collection of single bit signals that are referred to collectively by a single name. For example, single bit signals X[0], X[1] and X[2] comprise a 3-bit bus named X.

A circuit model is typically described in a hardware description language (HDL), and then synthesized into an internal data structure in a tool. FIG. 4 illustrates a data structure 400 that captures the circuit model 300 of FIG. 3. Each object in circuit model 300 has a corresponding database id, object type, a collection of object inputs (represented by database ids) and a name that can be used to refer to the object in a data structure in an independent manner. For example, in FIG. 3 object 336 is an AND gate with input signals X_0 328 and X_2 332 and output signal OUT_0 316. Hence, the data structure of FIG. 4 represents object 336 in FIG. 4 with a database id of 9, an object type of AND, a collection of input database ids 5 and 7 referring to input signals X_0 328 and X_1 332 and a name OUT_0. The data 400 so generated for the set of boundary nets can also be saved to a data file on the user's computer system. The saved data structure can be restored if required by the user. The techniques for saving and restoring generic data in a data structure are well known in the art.

Figure 7:
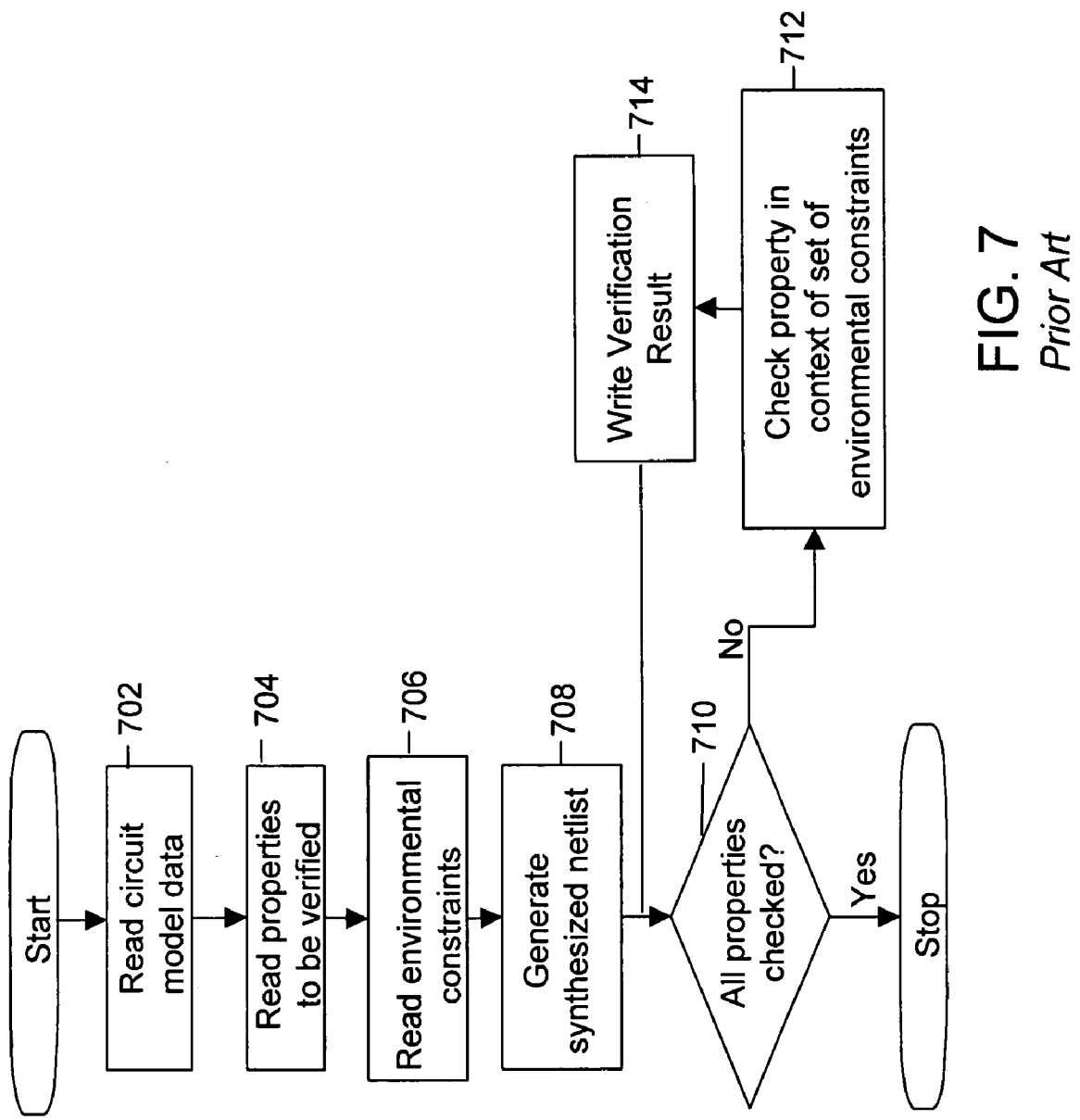
FIG. 7 is a flowchart depicting a conventional method for verifying a plurality of properties of a circuit model.

The flowchart in FIG. 7 shows a conventional method for verifying a plurality of properties for a circuit model. This verification can be performed using a technology well-known in the art such as that described in K. McMillan, "Symbolic Model Checking", PhD. thesis, Carnegie Mellon University, May 1992. In order to describe the invention, this method is explained henceforth.

The method reads an HDL description of the circuit model in step 702, properties to be verified in step 704 and the set of environmental constraints in step 706. A synthesized netlist of the circuit model is then generated in step 708. A netlist is a list of components such as gates, flip-flops etc. A netlist describes the properties of the components and the connections between them. A check is made in step 710 to confirm whether all the properties have been verified. If all the properties have not been verified, the next property is verified in context of a set of environmental constraints in step 712. After verification, the result is provided to the user in step 714. After verification of all the properties, the method terminates.

Figure 8:
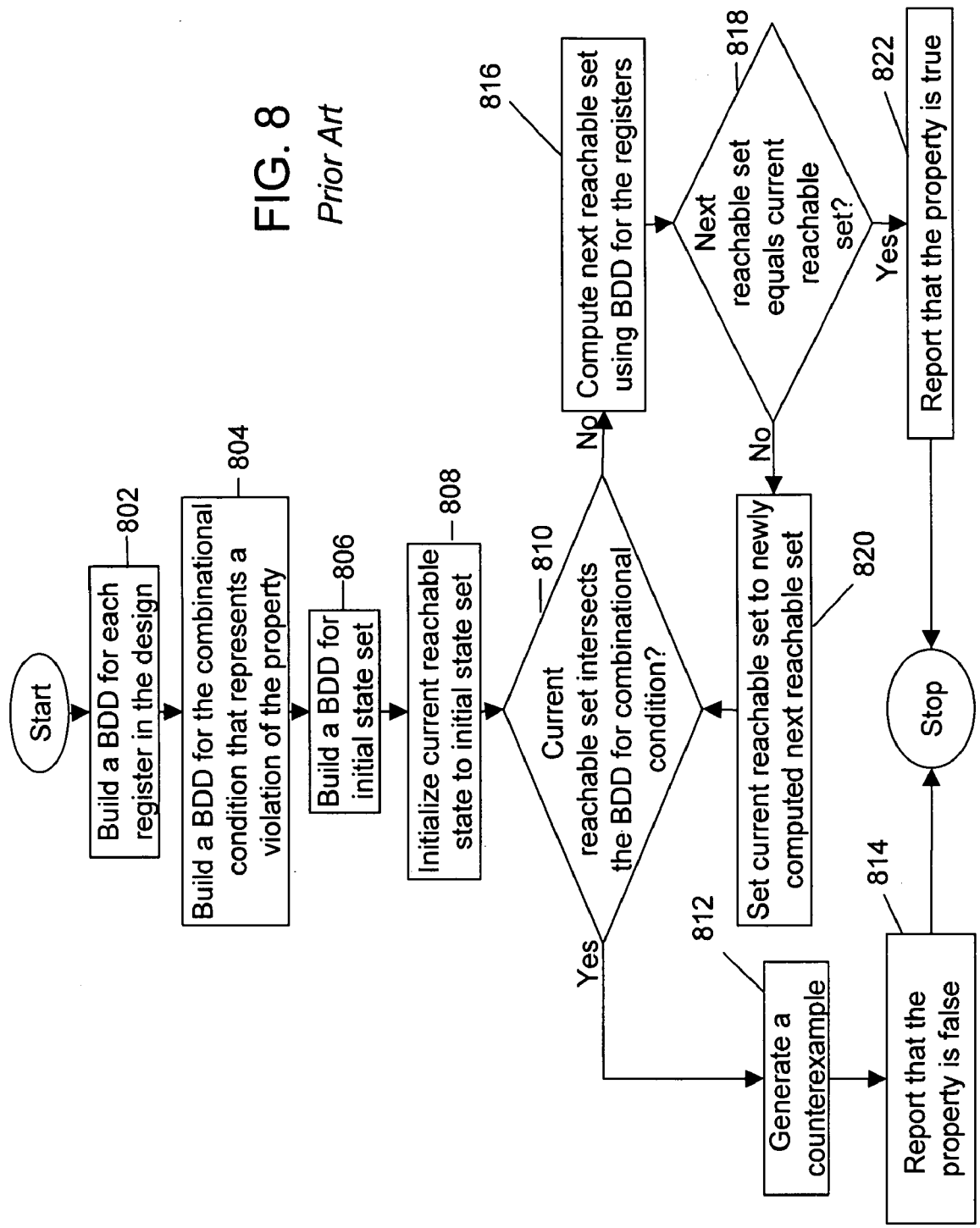
FIG. 8 is a flowchart depicting the conventional method to verify a property of a circuit model.

The abovementioned conventional method only permits the set of boundary nets to be the primary inputs of the circuit model. Step 712 uses a method well known in the state-of-the-art to check if a property is true or false. For purposes of clarity, and to highlight the improvements made by the current invention, this method (hereon referred as Method A) is described using a flowchart in FIG. 8. Note that the current invention is not limited to a BDD-based formal verification method, and the description of BDDs is only for illustrating some embodiments of the present invention.

The first step of Method A involves building a BDD in step 802 for each register in the specified circuit model. The BDD represents the next-state function of a register. These BDDs are functions of the primary inputs of the circuit model as well as the state variables of the circuit model. Here, each state variable represents the output of a register. Next step 804 involves building a BDD for the combinational condition that represents a violation of the specified property for the circuit model. Step 804 is followed by step 806 that involves building a BDD for the initial state set. The initial state set is defined as the set of states that the circuit model can attain after the circuit model has been initialized or reset. Further, a current reachable set is defined in step 808. The current reachable set is defined as the set of states that the circuit model can attain at the time of observation. The current reachable set is initialized to the initial state set. This is followed by a check in step 810 to verify whether the current reachable set intersects the BDD built in step 804. If the check results in a true condition then it implies that the specified property is not verified for the specified circuit model. Hence, a counterexample is generated according to step 812 and it is reported that the property is false in step 814. The method then terminates. If the check in step 810 results in a false condition, the reachable set is expanded in step 816 using the BDD for next-state functions built in step 802 to include more states that can be reached in the next clock cycle. A check in step 818 is then performed to verify if the expanded reachable set equals the current reachable set. If the check results in true condition then the method moves to step 822. In step 822, the result is reported and the method terminates. If the false condition is generated in step 818, then in step 820 the current reachable set is set to the newly computed reachable set of step 816. The control is then returned back to step 810. The process is thereafter repeated for the updated current reachable set.

Figure 9A:
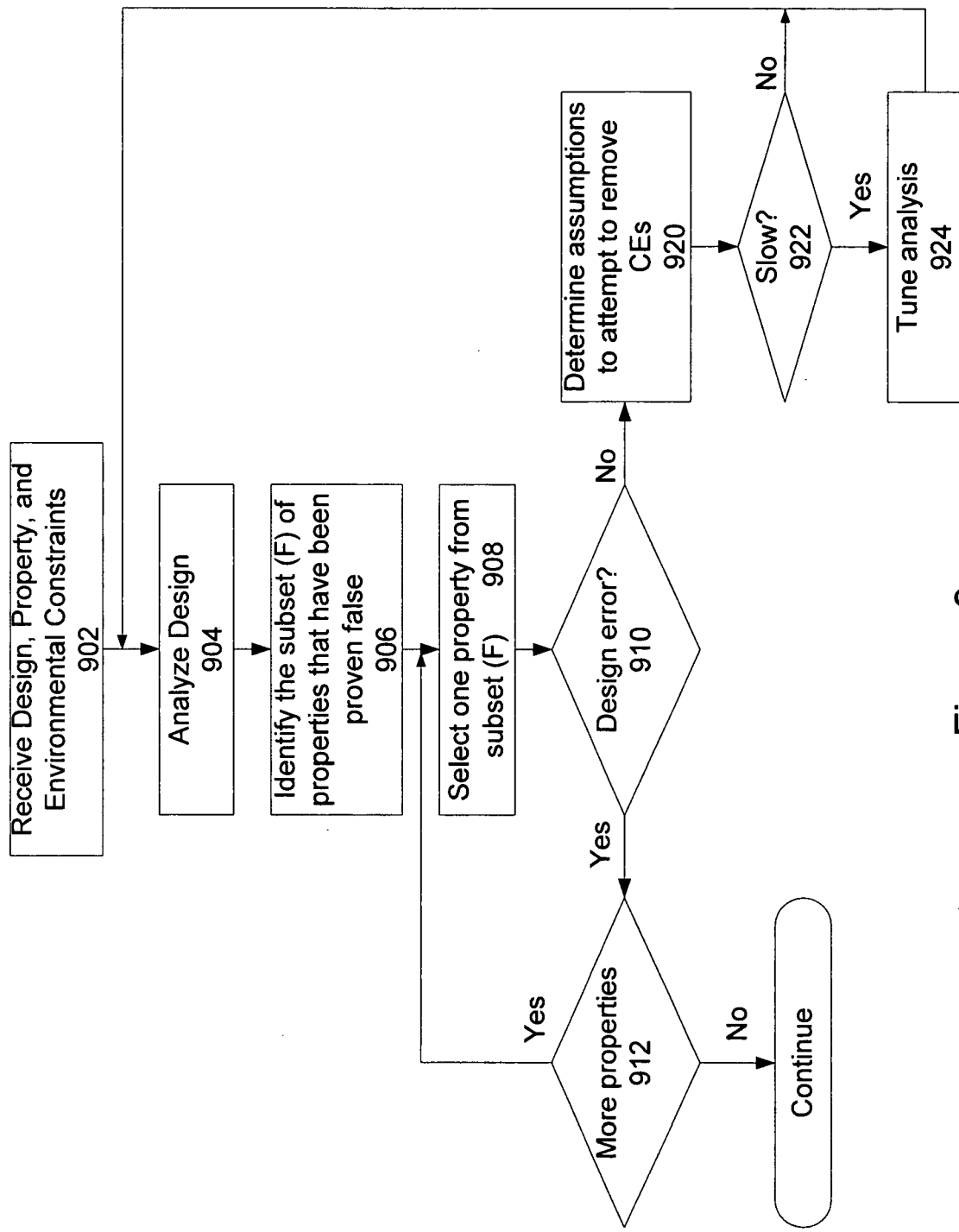
FIGS. 9a and 9b are flowcharts depicting an interactive method to verify a property in accordance with the present invention.

The preferred embodiment of the current invention describes a method that improves upon the conventional methods in many ways. The flow chart shown in FIG. 9a represents an extension of the methodology described in FIG. 7. It guides the users to remove false negative by providing feedback on the cost and effects on possible assumptions that are provided by the user or generated by the tool. With reference to FIG. 9a, the present invention receives 902 a design and properties/requirements. The invention analyzes 9a04 the design using, for example, the process set forth above with reference to FIG. 7. The present invention then identifies 906 the subset (F) of properties that have been proven false and selects 908 one property from this subset (F). If the user decides 910 that the result is because of a design error the invention determines 912 whether additional properties exist. If so, the process continues and another property from the subset (F) is selected 908. Otherwise, the process ends. If 910 the result is not because of a design error, then the invention determines 920 assumptions that are necessary to attempt to remove counterexamples (this process is described in greater detail below with reference to step 962). Then the user determines 922 whether the process was too slow. If the process was too slow the invention tunes 924 the analysis as described below with reference to FIG. 10. The process continues and the design is analyzed 904 again.

Figure 9B:
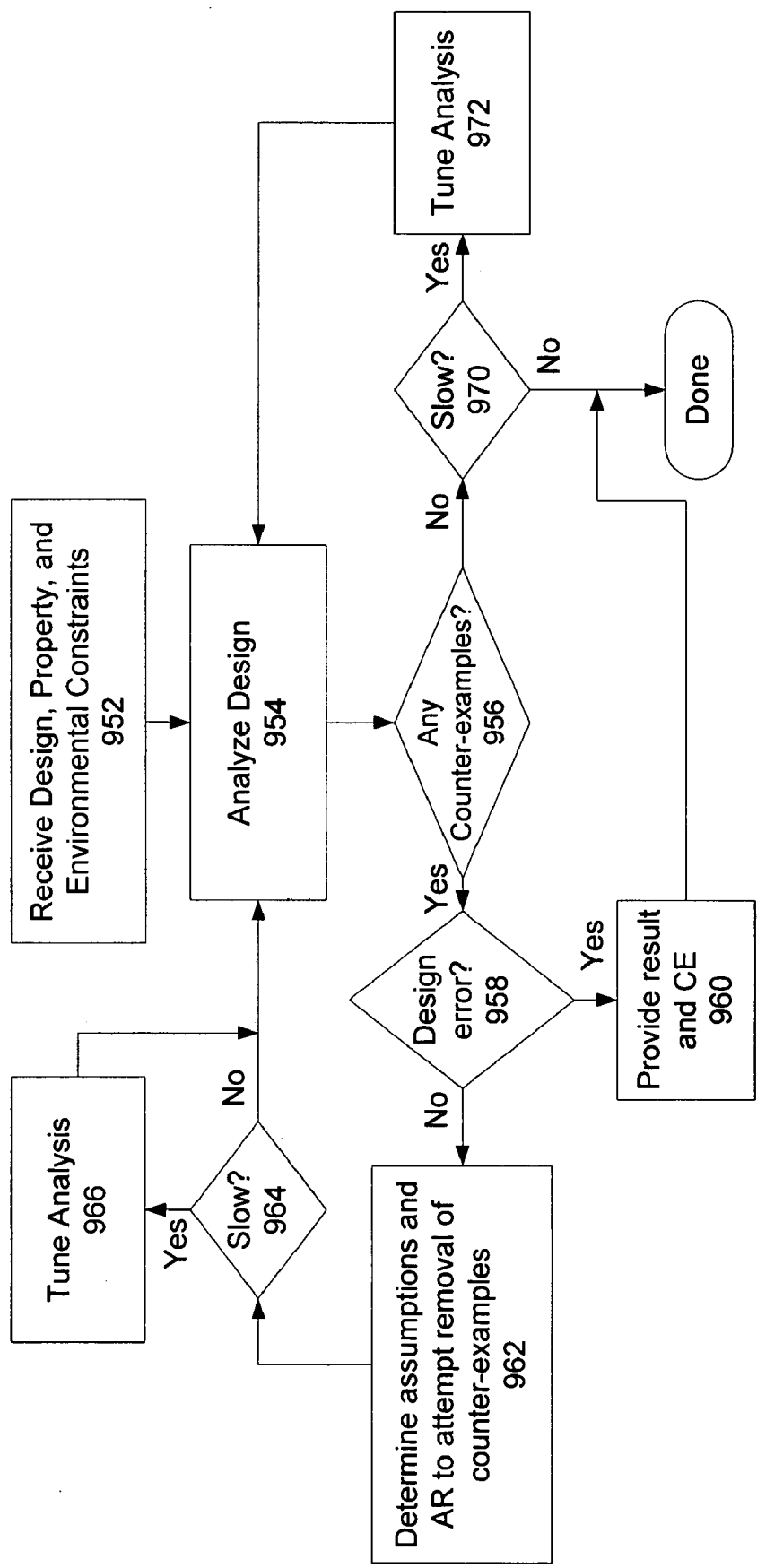

A flow chart that depicts a more complete embodiment of the current invention is set forth in FIG. 9b, which handles methodologies that use or do not use the concept of an analysis region (AR). A more detailed description of the use of an analysis region is set forth in U.S. patent application Ser. No. 10/389,316, referenced above. The present invention includes providing feedback to the users so that the user can evaluate the cost and effects of an action on the manipulation of the environmental constraints and/or analysis region before he actually directs the tool to take the action.

FIG. 9 describes a method in accordance with an embodiment of the present invention for verifying a property of a given circuit model in conjunction with a set of environmental constraints while providing the user with relevant information, for example, cost and effect, regarding possible modifications to the environmental constraints and the analysis regions. With reference to FIG. 9*b*, the circuit description, a property to be verified and an initial set of environmental constraints are received 952 by the system as inputs from the user. The design is analyzed 954, for example, using the method described above, to determine if a requirement is satisfied in context of the environmental constraints and the initial analysis region as determined by the tool. For ease of discussion, when the entire design is being analyzed we refer to this as the analysis region being the entire design.

The present invention analyzes 954 the design and determines whether the requirement is always true or not. If the requirement is not always true, counterexamples are generated, as described above. If one or more counter-examples are generated by the analysis 954, the counterexamples are presented to the user. The user determines 958 if the counterexample represents a design error or a false negative. If the user determines that the counterexample represents a design error, then the analysis conclusion and the counterexamples are provided 960 to the user and the verification process ends.

Figure 11:
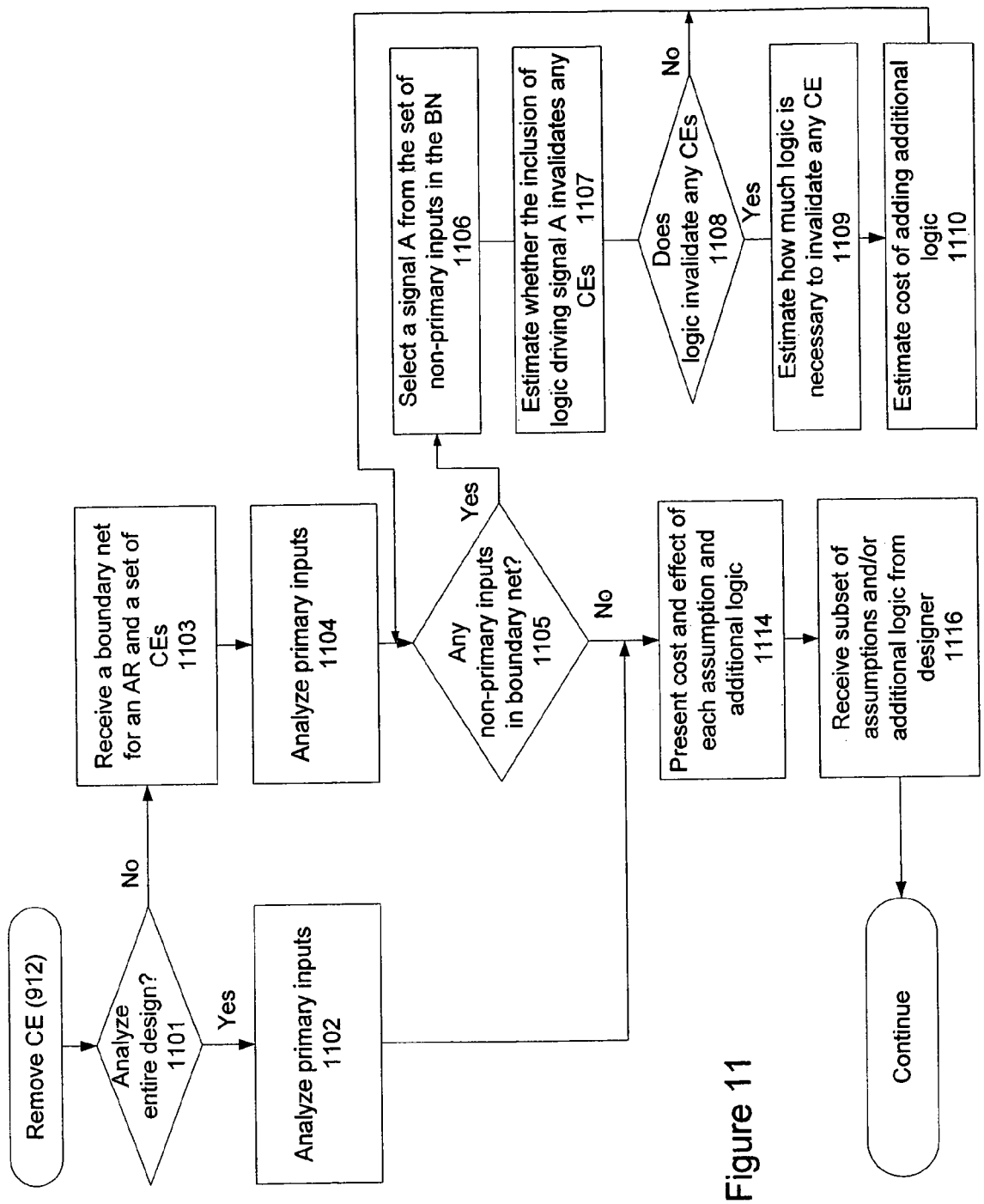
FIG. 11 is a flowchart illustrating the method of identifying assumptions and/or modifications to the analysis region for eliminating the identified counterexample(s) according to one embodiment of the present invention.
Figure 13:
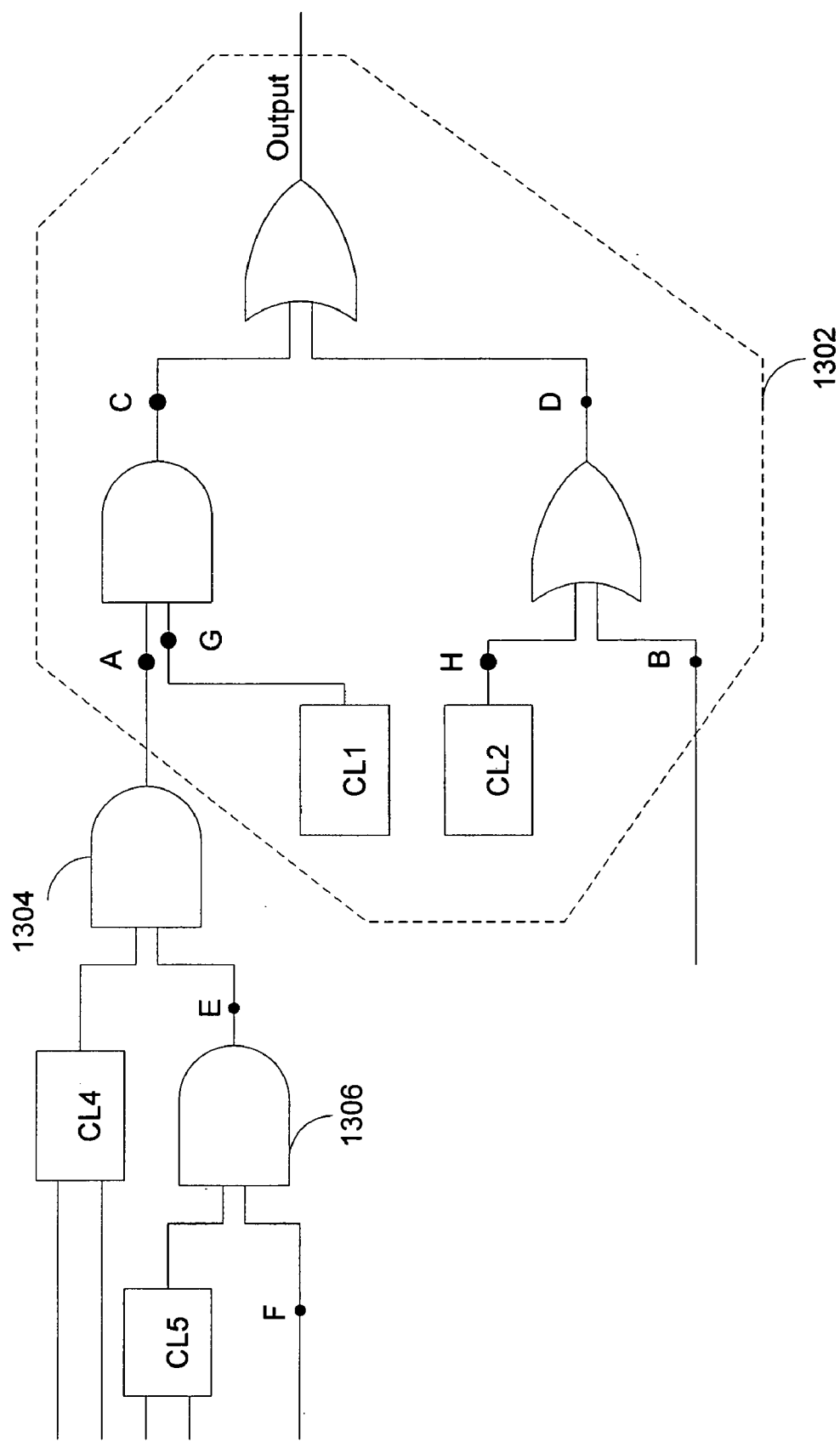
FIG. 13 illustrates an example of a design to be verified and includes an initial analysis region.

If the user determines 958 that the counterexamples do not correspond to a design error, then the present invention helps the user eliminate the counterexamples by identifying 962 the cost and effect of assumptions and/or modifications to the analysis region. A more detailed description of this process is illustrated in FIG. 11. FIG. 11 is a flowchart illustrating the method of identifying assumptions and/or modifications to the analysis region for eliminating the identified counterexample(s) according to one embodiment of the present invention. With reference to FIG. 11, if the analysis region is a subset 1101 of the entire design being analyzed then the present invention receives 1103 a set of nets for the analysis region (AR) and a set of counterexamples (CEs). FIG. 13 illustrates an example of a design to be verified and includes an initial analysis region 1302. With reference to the example in FIG. 13, the present invention receives 1103 the set of boundary nets as signal "A", primary signal "B" and the primary inputs driving complex logic CL1 and CL2 (the inputs are not shown). The present example has one assumption, F=0 and presumes that the user is attempting to prove that the output is equal to zero at all times (Output = = 0). Two counterexamples are identified, CE1 and CE2.

(CE1) A = = 1 && B = = X
(CE2) B = = 1 && A = = X

Figure 12:
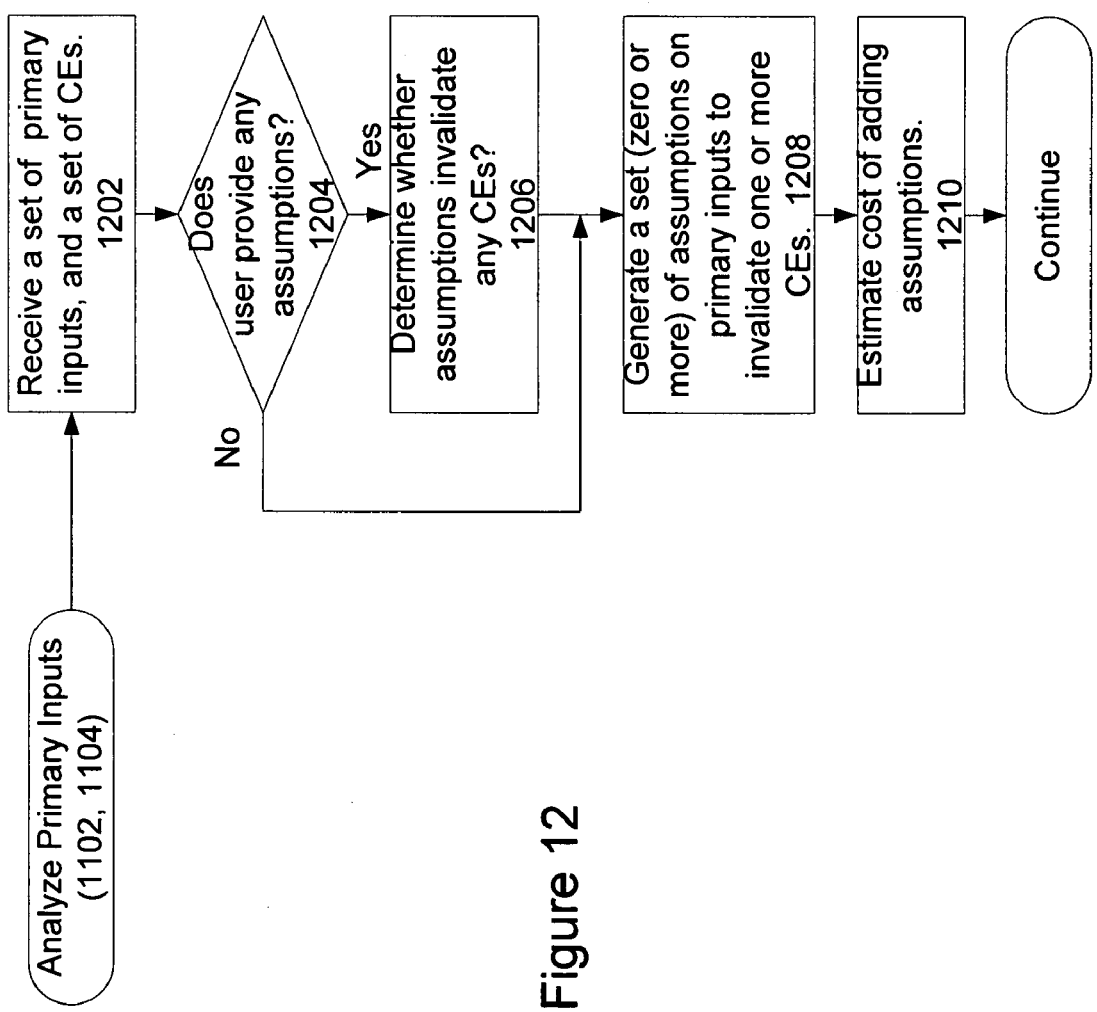
FIG. 12 is a flowchart illustrating a method for analyzing primary inputs according to one embodiment of the present invention.

The present invention then analyzes 1104 the primary inputs. In this example signal B is the only primary input (into the analysis region 1302) that is relevant to the two counterexamples. A more detailed description of the step of analyzing 1104 the analysis region is set forth in FIG. 12. FIG. 12 is a flowchart illustrating a method for analyzing primary inputs according to one embodiment of the present invention. With reference to FIGS. 12 and 13, the present invention receives 1202 a set of primary inputs (signal B) and a set of counterexamples (CE1 and CE2). If the user provides 1204 one or more assumptions then the present invention determines 1206 whether any of the assumptions invalidates any of the counterexamples. In this example, the user does not provide any assumption so the process continues by generating 1208 a set of assumptions on primary inputs that invalidates one or more counterexample. All of the identified primary inputs (in this example, signal B) are compared against the counterexamples to determine whether an assumption can be identified that will eliminate a counterexample. In this example, primary signal B is compared with CE1. However, in CE1 signal B is a "don't care" so any assumption for signal B will not eliminate CE1. For counterexample CE2 the value of B is equal to 1 so the present invention identifies the assumption B = = 0 as an assumption that will eliminate CE2.

The present invention then estimates 1210 the cost/savings of adding assumptions. The cost/savings can correspond to a variety of factors that affect the performance of the verification. For example, (1) the size of the corresponding BDD used to capture the assumption gives a quantitative indication of the speed of any operation that involves such an assumption. The larger the BDD, the slower the analysis will become; (2) the assumption may also simplify the analysis by causing other assumptions or logic in the design to become irrelevant to the analysis. For example, if an assumption "B==1" is introduced, because of the OR-gate between signal B and D, the signal D will have the value 1 regardless of the value in the signal H and the activities in CL2. The size of the corresponding BDD used to capture CL2 gives a quantitative indication of the resulting speed up; (3) instead of using a Boolean expression on existing signals in the design as an assumption, an assumption may assume the input to have the same value as a signal being driving by an arbitrary complex logic. In this case, it may capture temporal behavior. The cost or saving of including this assumption depends on the characteristics of the logic: (a) the size of the corresponding BDD used to capture the logic gives a quantitative indication of the speed of any operation involving this assumption, (b) a counter-like behavior in this logic leads to more iterations (steps 810, 816, 818, 820) in the analysis, and therefore, the range of possible values in this counter gives a quantitative indication of the number of iterations required to complete the analysis, (c) a datapath-like behavior in this logic leads to more states to be maintained as reachable set during the analysis in FIG. 8, and therefore, the width of the datapath gives a quantitative indication of the complexity in manipulating the reachable set.

There are also other possibilities regarding the cost/saving of adding an assumption, as we take into account for generic and application-specific design characteristics, such as the use of FIFO, memory, decoder, pipeline logic, etc. By providing feedback on the cost or savings of making this assumption, the user may make educated decision about whether to make the current assumptions, or spend more time in devising a better assumption, or even incorporate appropriate abstraction into the assumption. The present invention may also suggest appropriate abstraction for specific characteristics of the logic.

In this example, the savings of adding the assumption B = = 0 is not significant since the assumption will not eliminate the need to analyze any significant block of logic. That is, since signal B and signal H are inputs to an OR gate, even if signal B is zero, the output of the OR gate (signal D)

will still depend upon the output (signal H) of the complex logic block CL2. Therefore, even with this assumption complex logic block CL2 needs to be analyzed. However, the BDD corresponding to "B==0" is also small. Therefore, overall, adding the assumption will not introduce high overhead either, and it will probably reduce the states being stored in the reachable set As a result, the tool will conclude that it won't have adverse effect on the performance, and it is probably advantageous to add it in order to eliminate the counterexample CE2. The process then continues with the flow returning to FIG. 11.

The present invention continues by determining 1106 whether any logic driving the boundary nets of the analysis region 1302 would invalidate any of the counterexample. For example, in an embodiment of the invention, the answer may be estimated through a 3-value simulation of the full design using values from the counterexample for the primary inputs. If the answer is yes, the present invention estimates 1108 how much logic is necessary to invalidate any counterexample. The present invention estimates 1108 the amount of logic using an intelligent traversal of the netlist representing the design. This traversal can be performed using a conventional depth first search (DFS) algorithm. During the traversal, the search explores the part that is inconsistent when the values from the counterexample and from the simulation are different. In the example of FIG. 13, the only boundary net that is not a primary input is signal A (signal B is a primary input). The present invention identifies the logic driving signal A as an AND-gate 1304 that is driven by signal E and complex logic block CL4. Since the value of A is 1 in CE1, the present invention determines whether E or CL4 must be 0 or not. If so, it would invalidate CE1. During the DFS, the next signal being considered is E, and the present invention identifies that it is the output of an AND gate 1306 having inputs of signal F and complex logic block CL5. Therefore, the present invention checks whether F or CL5 must be 0 or not. Since an initial assumption the invention received at step 902 is that signal F is equal to 0, the present invention determines that with $F = = 0$ then signal E must be zero and subsequently signal A must be equal to zero. If $A = = 0$, then counterexample CE1 is invalidated since it requires signal A to be equal to one. Accordingly, the present invention estimates 1108 that adding the two AND-gates and the assumption "F==0" to the current analysis will invalidate CE1. Furthermore, since $F = = 0$, complex logic block CL5 does not need to be analyzed since its output has no effect on the verification. Similarly, since $E = = 0$, complex logic block CL4 does not need to be analyzed since its output has no effect on the verification. The present invention then estimates 1110 the cost of adding additional logic. As described above, a variety of measures can be used to estimate the cost/savings of adding additional logic. In this case, instead of dealing with a Boolean expression as an assumption, we are dealing with the logic driving the boundary nets. As a result, the complexity of the logic as determined by the size of the BDD used to capture the logic is usually higher than an assumption. Furthermore, it is also important to analyze cost or saving according to the characteristics of the logic, such as whether it is a counter, a datapath, a memory, a decoder, etc.

In this example the cost of adding additional logic includes the cost of adding two AND gates 1304 and 1306. However, the cost of complex logic blocks CL4 and CL5 are not included since the output of these complex logic blocks has no effect on the output. As a result, the corresponding BDD represents a three-input AND-gate. Furthermore, if we combine this BDD with the BDD corresponding to the assumption "F==0", we can simplify the analysis into a BDD that says A==0, which is even simpler than the three-input AND-gate. Furthermore, since the invention has identified that the assumption $F = = 0$ infers $A = = 0$, then the value of signal G has no effect on the output (since if $A = = 0$ then $C = = 0$). Accordingly, the present invention includes in the cost estimation the cost saved by eliminating the logic (CL1) driving signal G. The cost savings can be estimated based upon the size of the BDD representing the CL1 logic, and also whether the CL1 logic is a counter or not, etc.

After estimating the cost and effect of each assumption and additional logic to the analysis region, the invention presents 1114 the cost and effect to the user using a graphical user interface or other technique to provide the user with the information, e.g., sending the information to a file. The present invention provides the assumptions, effect and cost generated in step 1104 or 1102 (discussed below) along with the cost and effect of adding logic as determined in steps 1108 and 1110. The invention may also prioritize the assumptions by their effects and costs, and extract analysis such as "adding assumption A will lead to a faster analysis than adding assumption B" or "adding both assumptions A and B will remove all existing counterexamples, but will slow down the analysis a lot". It may also suggest possible abstraction in order to incorporate a certain assumption with reduced cost.

In this example, the present invention outputs the assumption $B = = 0$, the effect of the assumption, i.e., an indication that this assumption will eliminate counterexample CE2, and the cost of adding this assumption which in this example is not significant—and can be elaborated as the size of additional BDDs, e.g., 10. The present invention then receives 1116 a selection of the assumptions and/or additional logic from the user. The user may select one or more of the possibilities generated by the present invention or may provide other assumptions or logic that have not been suggested by the present invention. The subset may be a subset of zero or a subset that is equal to the superset, i.e., the user can select all or none of the possibilities generated by the present invention.

If the verification is of a complete design 1101, e.g., if the analysis region is the entire design to be verified, then the present invention analyzed 1102 primary inputs. The details for analyzing 1102 the primary inputs is described above with reference to step 1 104 and FIG. 12. After analyzing 1102 the primary inputs the cost and effect of each assumption is presented 1114 to the user and the invention receives 1114 a subset of the assumptions from the designer as described above. In this case, during the tuning 916 of the analysis, described below, one embodiment of the invention may focus on only removing or changing assumptions, and therefore, keeping the analysis region as the full design, or remove logic from the design to form an analysis region that is not the entire design.

Figure 14:
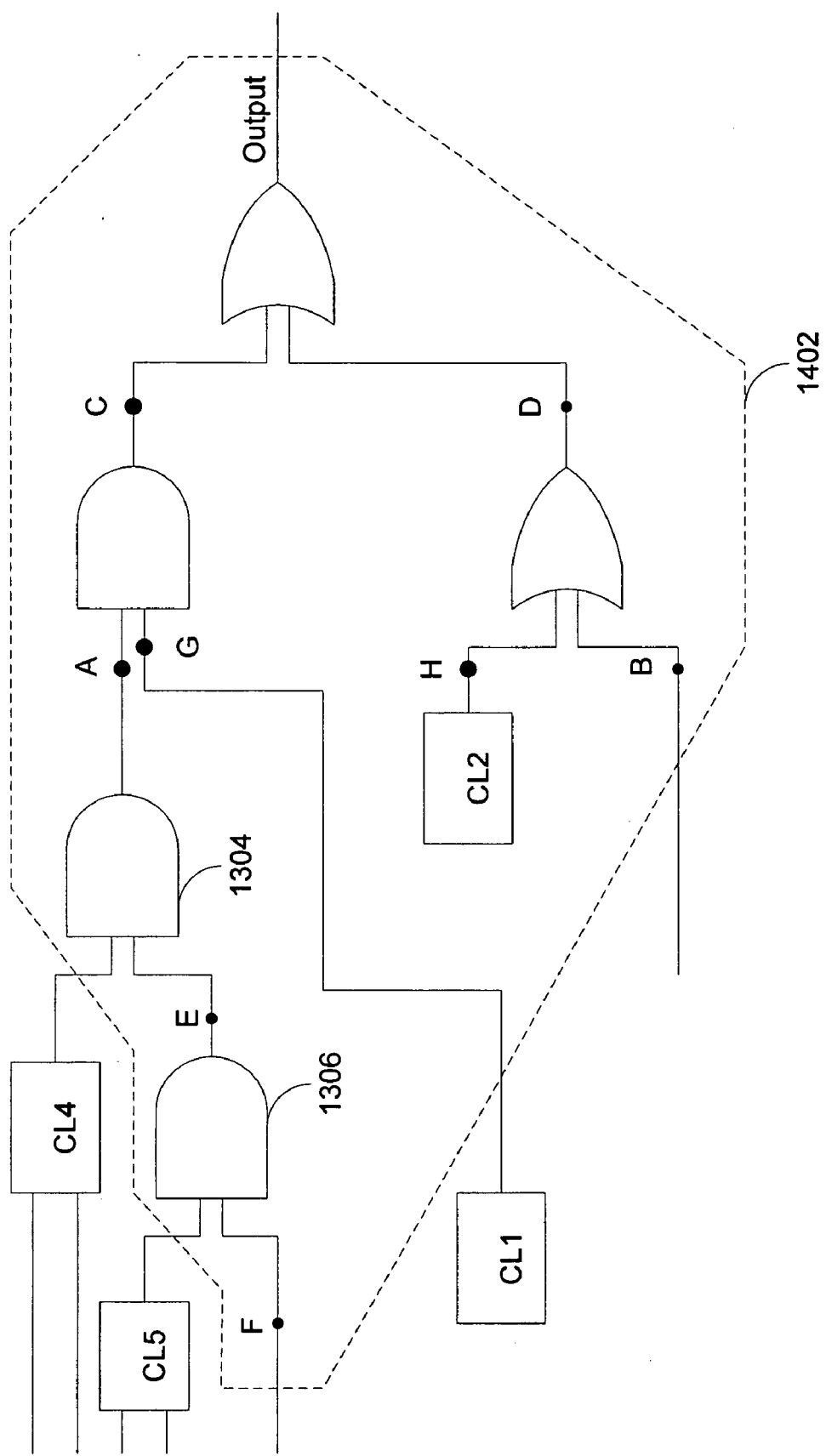
FIG. 14 illustrates an example of a design to be verified including a modified analysis region.

In the present example, the user elects to utilize the additional logic driving the signal A (including AND gates 1304 and 1306) and the assumption $B = = 0$. Thus the analysis region 1402 changes as illustrated in FIG. 14. FIG. 14 illustrates an example of a design to be verified with the modified analysis region.

After identifying 962 potential assumptions and potential analysis regions to attempt removal of counterexamples, the present invention receives 964 an indication from the user as to whether the verification process was too slow. It is not uncommon for verification process to take several hours for complex designs. If the process is too slow, the present invention provides options and information to the user regarding how to decrease the verification time by tuning 966 the analysis. Details about analysis tuning 966 are described in detail in FIG. 10.

Figure 10:
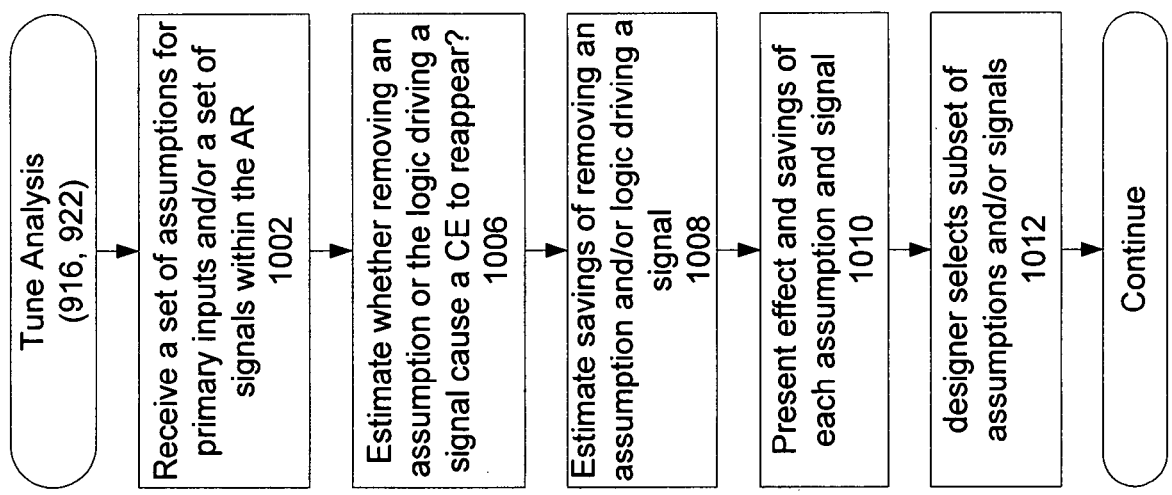
FIG. 10 illustrates a method for tuning the analysis according to one embodiment of the present invention.

FIG. 10 illustrates a method for tuning the analysis according to one embodiment of the present invention. The present invention receives 1002 a set of assumptions for primary inputs and/or a set of signals within the analysis region. In the example described above and illustrated in FIG. 14, the current set of assumptions for the primary inputs is:

B == 0
F == 0.

In this example signals within the analysis region include signals C, D, H, A, E, etc. In step 1002, either the tool selects a subset of these signals to be analyzed, or the user manually identify them. Let's say the signal H is selected. The analysis region 1402 is being analyzed and the set of stored counterexamples are CE1 (A == 1 && B == X) and CE2 (B == 1 && A == X). As described above, the goal is to prove that the output is zero at all times. In this example, there are no outstanding counterexamples since the user accepted the assumption and additional logic to eliminate the counterexamples in step 962. However, in other examples, counterexamples may exist but their existence does not change the tuning analysis 966 process according to one embodiment of the present invention. Since the process steps can be accomplished differently, e.g., steps 964 and 966 can occur prior to 962, in an alternate embodiment, the analysis tuning step can account for whether making another assumption or adding/removing logic will eliminate an existing counterexample.

The present invention estimates 1006 whether removing an assumption or logic driving a signal will cause a previously invalidated counterexample to once again become a valid counterexample. The present invention iteratively analyzes each assumption and logic that drives a signal to determine whether such a known counterexample becomes valid. In this example, the present invention analyzes the situation where the assumption B == 0 is eliminated and determines that eliminating this assumption has no effect on the first counterexample CE1 but will cause the second counterexample CE2 to become valid once again. Similarly, the present invention analyzes the situation where the assumption F == 0 is eliminated and determines that eliminating this assumption has no effect on the counterexample CE2 but will cause the counterexample CE1 to become valid once again. The invention then analyzes whether removing the logic driving signal H will cause a previous counterexample to become valid. In this example, removing the logic driving signal H (CL2) will not cause either CE1 or CE2 to reappear.

The present invention then estimates 1008 the cost savings of removing each assumption and each collection of logic driving a signal. Removing the assumption B == 0 will not result in any significant cost increase because no logic has been eliminated because of this assumption. In contrast removing the assumption F == 0 will result in a significant cost increase because the cost of analyzing complex logic blocks CL1, CL4 and CL5 (or alternatively only CL1, since CL4 and CL5 can be eliminated be modifying the analysis regions) is significant in this example and may have a complexity on the order of several thousand because of the sizes of the BDDs for three pieces of logic. Because of the complication introduced by the logic blocks originally rendered irrelevant by the assumption, the current embodiment of the invention presents several alternatives regarding the assumption "F==0". For example, putting back CL1, CL4, and CL5 so that the cost would be high, and keeping out CL1, CL4, and CL5 so that the cost would be low but the chances of causing a new counterexample to appear is high. Removing the complex logic driving signal H (CL2) will also result in a cost savings based upon, for example, the size of the BDD representing the CL2 logic. The cost information and the effect on previous (or existing) counterexample information is presented 1010 to the user and the user may select 1012 none or one or more of the assumptions and/or logic driving signals. In addition, the present invention permits the user to enter assumptions or modify the logic to be analyzed that the present invention does not present. In this example, the user elects to eliminate the logic (CL2) that drives signal H.

Note that while the removal of the logic CL2 will not cause the previously invalidated counterexamples to reappear, it will lead to a new counterexample that represents a false negative, as removing CL2 enables H to take value 0 or 1 at any time.

The procedure continues by analyzing 954 the design with the modifications selected by the user. In this iteration of the design analysis, one counterexample (CE3) is identified.

H == 1 && B == X && F == X

That is, the output is equal to 1 when signal H is equal to 1. The present invention identifies 956 that a counterexample exists and the user indicates 958 that the counterexample is not the result of a design error. Then the present invention attempts to remove the counterexample in step 962. As described above, step 962 is described in greater detail in FIG. 11. Since the entire design 1101 is not being analyzed, the present invention receives a set of boundary nets for the analysis region along with the currently valid counterexamples, i.e., CE3. Eventually the present invention detects the addition of logic CL2 will invalidate CE3 and the user may select to add CL2 back into the analysis region.

The present invention then analyzes 1104 the primary inputs (signals B and F) as described above with reference to FIG. 12. The present invention identifies whether the user has added 1204 any additional primary input assumptions. In this example, no additional assumptions are added so the present invention attempts to generate a set of assumptions on primary inputs that will eliminate counterexamples. Neither signal B or signal F will have any effect on CE3 since both are "don't care" in CE3. The process continues by determining 1106 whether any logic drive the inputs to the analysis region 1402. Complex logic block CL2 drives signal H, which is an input to the analysis region. Note that CL2 is the logic that was previously eliminated from the analysis region in step 966. The present invention estimates 1108 how much logic is necessary to invalidate any counterexample. In this example, the invention estimates 1108 that entire block CL2 should be added to the analysis region. The invention then estimates 1110 the cost of adding CL2 back, and presents 1114 the cost and effect of adding the logic to the user. In the example, the user elects to add CL2 back despite the cost because it eliminates a counterexample and the present invention receives 1116 this instruction.

In this situation the user does not indicate 964 that the analysis is too slow and the design is analyzed 954 once again. No counterexamples are generated 956 by the design analysis 954. The user is then provided an opportunity to indicate 970 whether the analysis was too slow. If the analysis was not too slow the process ends. If the analysis was too slow the present invention tunes 972 the analysis. The process for tuning 972 the analysis is the same as the process described above with reference to step 966. The analysis tuning 972 process is described in greater detail with reference to FIG. 10. The invention receives 1002 the set of assumptions for primary inputs and/or signals within the analysis region, as set forth above. Then the invention estimates 1006 whether removing an assumption or logic driving a signal will cause a counterexample to reappear. At this point the invention will analyze the assumptions with reference to counterexamples CE1, CE2 and CE3. In addition, the logic driving signal H (CL2) is analyzed. However, since the previous iteration of step 1006 (which was called from step 964), a new counterexample was identified and eliminated, i.e., CE3. In estimating 1006 whether the removal of complex logic CL2 will cause a counterexample to reappear, the removal of CL2 is compared to CE3 (H = = 1). Removing the logic CL2 may result in the reappearance of CE3, and this information is presented 1010 to the user along with the other effects and savings. The user decides 1012 whether to make any modifications to the assumptions or signals, in this example the user decides that no additional modifications are necessary. In one embodiment the invention continues by analyzing 954 the design. In another embodiment, since no changes occurred in the analysis tuning 972 step, the process ends.

Figure 15:
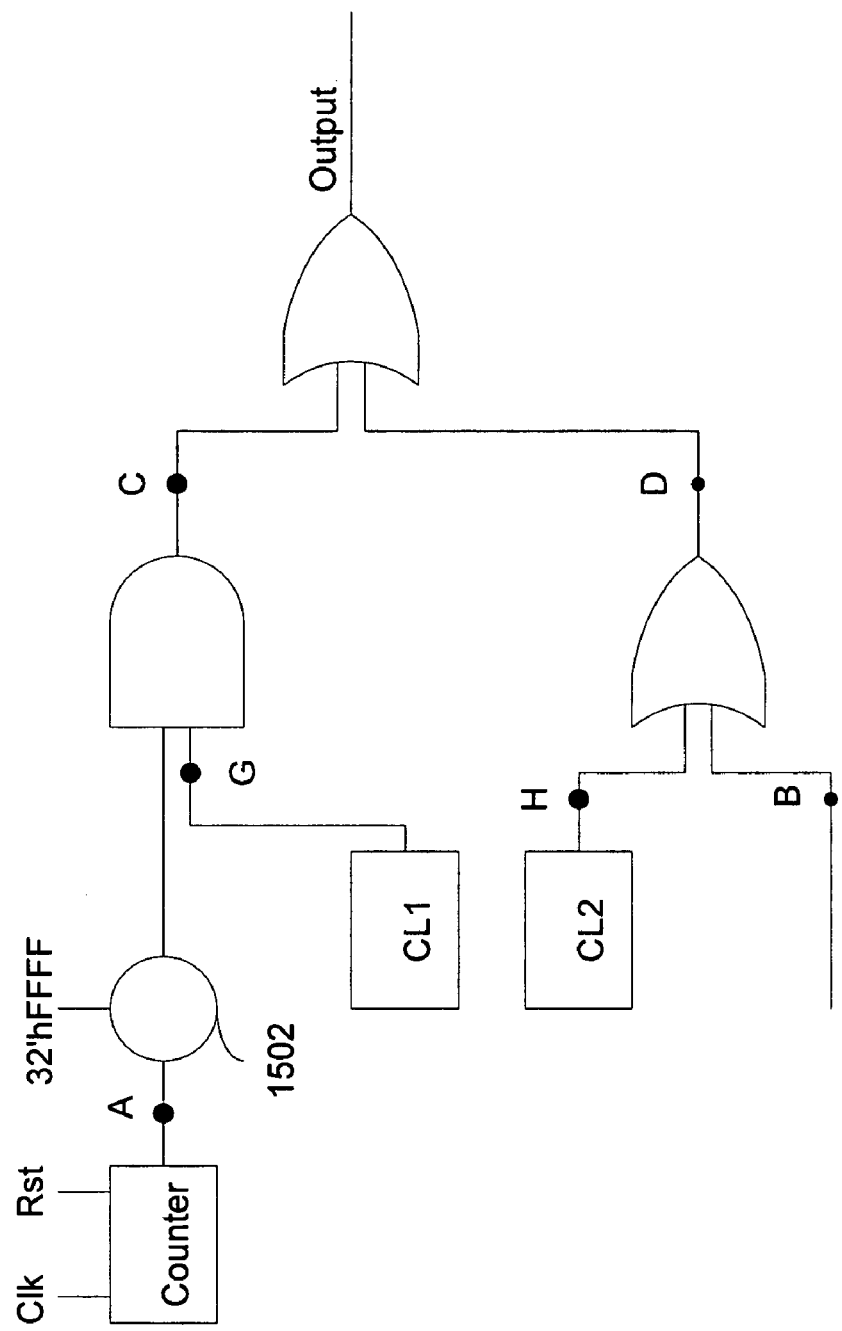
FIG. 15 is an illustration of a non-sequential circuit that can be analyzed by the present invention.

The above examples only have combinational logic so the cost can be determined easily using, as one factor, the size of the BDD representing the logic. However, when sequential logic is in the design different factors are used to determine the cost/complexity. FIG. 15 is an illustration of a sequential circuit that can be analyzed by the present invention.

For this example, the design is defined as:
// the design
input F;
input B;
wire output = C || D;
wire C = (A= =32'hFFFF) && CL1
wire D = B || CL2
reg [31:0] A;
always @((posedge clk)
if (rst) A <=0;
else A <= A + 32'b1;

The user tries to prove that output = = 0 at all times. After this design is analyzed 904 using an analysis region that does not include the counter, a counterexample CE4 is identified at the first cycle after reset.
A = =32'hFFFF && B = = X If the user does not think CE4 represents a design error 908 then the present invention identifies 912 assumptions and the analysis region to attempt to remove counterexamples. With reference to FIG. 11, in this example the entire design is not being analyzed 1101 so the present invention receives a set of boundary nets for the analysis region and the counterexample (CE4). The specified set of boundary nets includes signal A, signal B and any primary inputs (not shown) driving CL1 or CL2. The present invention then analyzes 1104 the primary input B. The present invention determines 1106 that in the design, there is logic driving the boundary net A and estimates 1108 how much logic is necessary to invalidate the current counterexample. The invention determines 1108 the counter logic will invalidate CE4, because the counter A can only take the value 0 right after reset. As per FIG. 15, the invention identifies a counter as the logic driving signal A. The counter resets the value of A upon reset which eliminates the counterexample (CE4). Signal A is compared to the value 32'hFFFF by comparator 1502. The present invention estimates 1110 the cost of adding this additional logic. The cost calculation can include an estimation of the BDD and also includes another technique that identifies counters which, with the counter of FIG. 15, can result in a large number of iterations, e.g., $2^{32}$— which can significantly increase the cost of analyzing this logic. In particular, even if the BDD representing the counter is not large, the fact that it is a counter will lead to a larger number of iterations that need to be performed in step 810, 816, 818, and 820 in FIG. 8. The present invention identifies loops and counters in the design in order to more accurately estimate the analysis cost. One technique for accomplishing this is described in U.S. patent application Ser. No. 10/736, 826 filed on Dec. 15, 2003 by Chung-Wah Norris Ip, Lawrence Loh, Vigyan Singhal, and Howard Wong-Toi, entitled "Managing Formal Verification Complexity of Designs with Counters."

Figure 16:
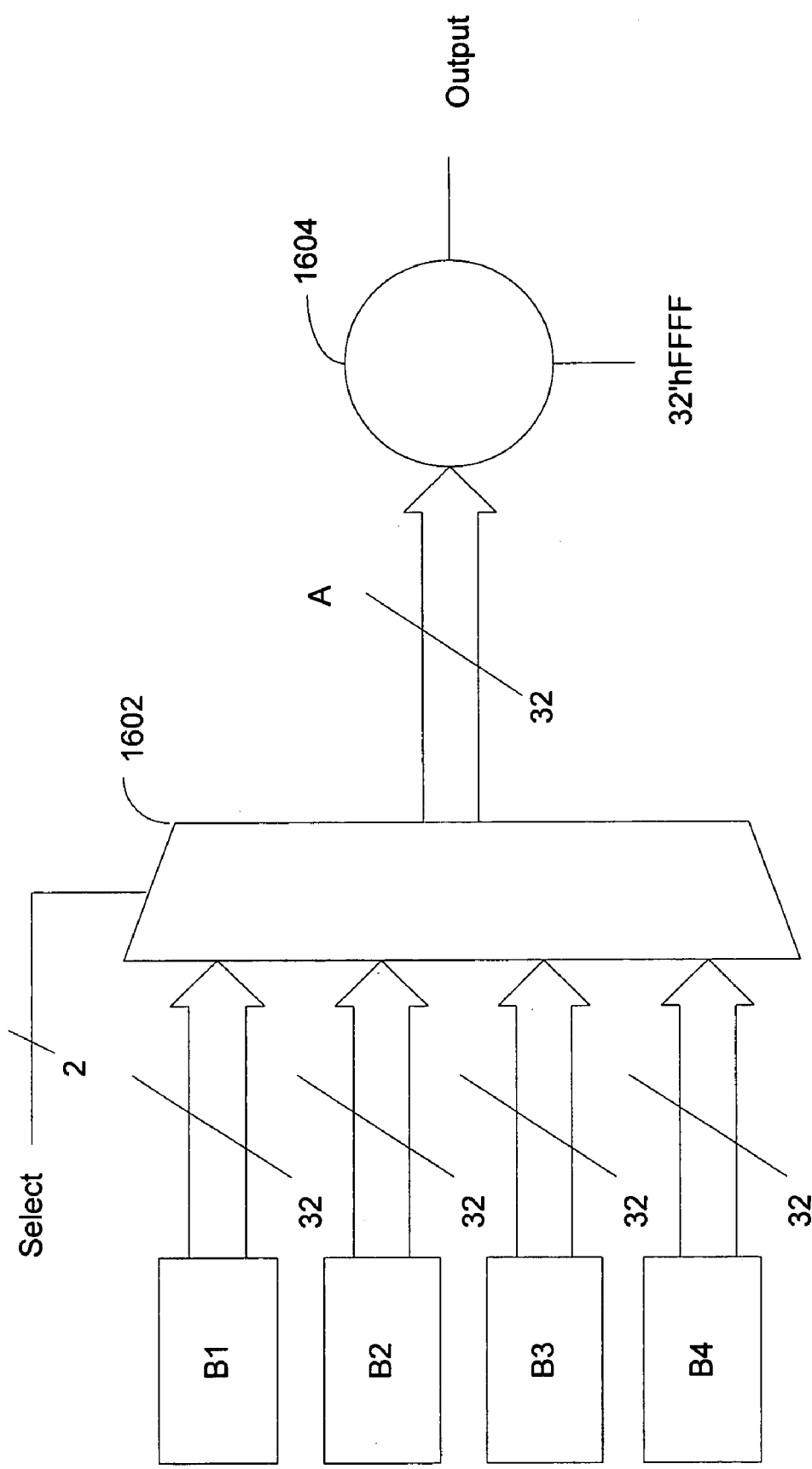
FIG. 16 is an illustration of a design that includes multiplexor that can be analyzed by the present invention.

The system also operates with other design elements, e.g., multiplexors. FIG. 16 is an illustration of a design that includes multiplexor that can be analyzed by the present invention. Multiplexor (Mux) 1602 has a 2-bit select signal that is a primary input and receives four 32-bit data buses driven by complex logic blocks B1, B2, B3 and B4. The output of the Mux is signal A. A comparator 1604 compares the value on signal A with the value "32'hFFFF" and generates a 1 signal on the output if there is a match. In this example the user attempts to prove that the output signal is always equal to 0. A Verilog description of the circuit is:
// the design
input [1:0] select;
wire output = (A==32'hFFFF);
reg [31:0] A;
always @(posedge clk)
  case (select) begin
  2'b00:
    A <= B1;
  2'b01:
    A <= B2;
  2'b10:
    A <= B3;
  2'b11:
    A <= B4;
  end
wire [31:0] B1= complex_logic_BB1;
wire [31:0] B2= complex_logic_BB2;
wire [31:0] B3= complex_logic_BB3;
wire [31:0] B4= complex_logic_BB4;

In this example, the entire design is being analyzed. After receiving 952 the above design requirements the present invention analyzes 954 the design and, for this example, identifies two counterexamples (CE5 and CE6)
CE5: B1 = = 32'hFFFF && Select = = 2'b00
CE6: B 2= = 32'hFFFF && Select = =2'b01

The primary inputs deemed relevant by the present invention are "Select" and inputs driving complex logic B1 and complex logic B2.

After analyzing 954 the design, the present invention identifies 956 the two counterexamples and the user indicates 958 that the counterexamples are not caused by a design error. The present invention identifies 962 the assumptions and analysis region to attempt to remove the counterexamples. As described above, step 962 is described in more detail with reference to FIG. 11. In this example the entire design is analyzed 1101 therefore the present invention analyzes 1102 the primary inputs. With reference to FIG. 12, the present invention receives 1202 a set of primary inputs (Select, inputs to B1 and B2) and a set of counterexamples (CE5 and CE6). The user provides 1204 an assumption of
~(select = = 2'b00)

The present invention analyzes the assumption and determines 1206 whether the assumption eliminates any of the counterexamples. In this example, the assumption does not eliminate CE6 but does eliminate CE5 since this counterexample requires that the value of the select signal be 2'b00. The present invention continues by generating 1208 assumptions on the primary inputs that will invalidate counterexamples. In one embodiment of the present invention, the invention reviews CE5 and determines that the assumption the user provided is the only assumption that will invalidate CE5. The invention then analyzes CE6 and determines that the assumption "~(select = = 2'b01)" will invalidate CE6.

The invention then estimates 1210 the cost of adding these assumptions. For the assumption "~(select = = 2'b00)" the cost of verification will decrease because the logic corresponding to B1 can be excluded from the analysis. The cost savings can be identified as the BDD size the logic in B1. Similarly, for the assumption "~(select = = 2'b01)" the cost of verification will decrease because the logic corresponding to B2 can be excluded from the analysis. The cost savings can be identified as the BDD size the logic in B2. The process then continues and the invention presents 1114 the cost and effect of each assumption to the user who can elect assumptions to use. The present invention receives 1116 the assumptions and the process continues.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A computer based method for verifying properties of a circuit model of a digital circuit design comprising the steps of:
   receiving one or more verification requirements for the circuit model;
   receiving one or more counterexamples, including a first counterexample, that does not satisfy one or more of said verification requirements for the circuit model;
   identifying a first environmental constraint for one or more primary inputs that invalidates said first counterexample; and
   automatically determining a first cost-of-analysis value representing an estimate of a cost of the analysis for the design, without performing a complete circuit model analysis, using said first environmental constraint having the steps of:
      identifying a first portion of logic in the circuit model that is not necessary to analyze due to the first environmental constraint; and
      determining a first cost value representing an estimate of computational savings resulting from not analyzing said first portion of logic.

2. The method of claim 1, further comprising the step of presenting said first cost-of-analysis value to a user.

3. The method of claim 1, wherein the circuit model is a register transfer level (RTL) design model.

4. The method of claim 1, wherein said step of determining a first cost value comprises the step of:
   identifying a size of a binary decision diagram (BDD) corresponding to said first portion of logic to estimate said first cost-of-analysis value.

5. The method of claim 1, wherein said step of automatically determining a first cost-of-analysis value further comprises the steps of:
   identifying a second portion of logic that constrains one or more primary inputs according to said first environmental constraint; and
   determining a second cost value representing an estimate of computational cost resulting from analyzing said second portion of logic wherein said first cost-of-analysis value is equal to a combination of said first and second cost values.

6. The method of claim 1, wherein said step of receiving one or more counterexamples comprises the steps of:
   analyzing the circuit design to identify said first counterexample that does not satisfy one or more of said verification requirements for the circuit model.

7. The method of claim 1, wherein said one or more counterexamples includes a second counterexample, further comprising the steps of:
   identifying a second environmental constraint that invalidates said second counterexample; and
   automatically determining a second cost-of-analysis value representing an estimate of a cost of the analysis for the design without performing a complete design analysis and using said second environmental constraint.

8. The method of claim 7, further comprising the step of:
   presenting said first and second cost-of-analysis values to the user.

9. The method of claim 8, further comprising the steps of:
   receiving a first user-selected subset of said first and second environmental constraints in response to said first and second cost-of-analysis values; and
   analyzing the circuit design with said first user-selected subset of environmental constraints.

10. The method of claim 1, further comprising the steps of:
    identifying a second environmental constraint for a primary input that invalidates said first counterexample; and
    automatically determining a second cost-of-analysis value representing an estimate of a cost of the analysis for the design, without performing a complete circuit model analysis, using said second environmental constraint.

11. The method of claim 10, further comprising the step of:
    presenting said first and second cost-of-analysis values to a user.

12. The method of claim 10, further comprising the step of:
    comparing said first and second cost-of-analysis values to identify the cost-of-analysis value having a lower cost.

13. A computer based method for verifying properties of a circuit model of a digital circuit design comprising the steps of:
    receiving one or more verification requirements for the circuit model;
    receiving one or more counterexamples, including a first counterexample, that does not satisfy one or more of said verification requirements for the circuit model;
    identifying a first environmental constraint for one or more primary inputs that invalidates said first counterexample; and
    automatically determining a first cost-of-analysis value representing an estimate of a cost of the analysis for the design, without performing a complete circuit model analysis, using said first environmental constraint having the steps of:

identifying a first portion of logic that constrains one or more primary inputs according to said first environmental constraint; and determining a first cost value for said first portion of logic representing an estimate of a computational cost resulting from analyzing said first portion of logic.

14. The method of claim 13, further comprising the step of presenting said first cost-of-analysis value to a user.

15. The method of claim 13, wherein said step of determining a first cost value comprises the step of:

identifying a size of a binary decision diagram (BDD) corresponding to said first portion of logic to estimate said first cost-of-analysis value.

16. The method of claim 13, wherein said one or more counterexamples includes a second counterexample, further comprising the steps of:

identifying a second environmental constraint that invalidates said second counterexample; and automatically determining a second cost-of-analysis value representing an estimate of a cost of the analysis for the design without performing a complete design analysis and using said second environmental constraint.

17. The method of claim 13, further comprising the steps of:

identifying a second environmental constraint for a primary input that invalidates said first counterexample and automatically determining a second cost-of-analysis value representing an estimate of a cost of the analysis for the design, without performing a complete circuit model analysis, using said second environmental constraint.

18. A computer based method for verifying properties of a circuit model of a digital circuit design comprising the steps of:

receiving one or more verification requirements for the circuit model; and determining a first cost-of-analysis value for tuning the analysis of the design, representing an estimate of a cost of the analysis for the design, without performing a complete circuit model analysis, having the steps of receiving a first signal in the circuit model;

identifying a first portion of logic in the circuit model that drives the said first signal; and determining a first cost value representing an estimate of computational savings resulting from not analyzing said first portion of logic.

19. The method of claim 18, wherein said step of determining a first cost-of-analysis value further comprises the steps of:

receiving a second portion of logic in the circuit model to drive said first signal; and determining a second cost value representing an estimate of a computational cost resulting from analyzing said second portion of logic wherein said first cost-of-analysis value is equal to a combination of said first and second cost values.

20. The method of claim 18, further comprising the step of presenting said first cost-of-analysis value to a user.

21. The method of claim 18, wherein the circuit model is a register transfer level (RTL) design model.

22. The method of claim 18, wherein said step of determining a first cost value comprises the step of:

identifying a size of a binary decision diagram (BDD) corresponding to said first portion of logic to estimate said first cost-of-analysis value.

23. A computer based method for verifying properties of a circuit model of a digital circuit design comprising the steps of:

receiving one or more verification requirements for the circuit model;

receiving one or more counterexamples including a first counterexample, that does not satisfy one or more of said verification requirements for the circuit model, said counterexample from an analysis using an analysis region having boundary net signals;

receiving a first portion of logic in the circuit model that was not previously analyzed, and drives one or more of said boundary net signals;

automatically determining a first cost-of-analysis value representing an estimate of a cost of the analysis for the design, without performing a complete circuit model analysis, having the steps of:

determining a first cost value representing an estimate of a cost of an analysis of said first portion of logic.

24. The method of claim 23, further comprising the step of presenting said first cost-of-analysis value to a user.

25. The method of claim 23, further comprising the steps of:

receiving a second portion of logic in the circuit model that was not previously analyzed, and drives one or more of said boundary net signals that invalidates said first counterexample; and automatically determining a second cost-of-analysis value representing an estimate of a cost of the analysis of the second portion of logic.

26. The method of claim 23, further comprising the step of:

presenting said first and second cost-of-analysis values to a user.

27. The method of claim 26, further comprising the step of:

comparing said first and second cost-of-analysis values to identify the cost-of-analysis value having a lower cost.

28. A computer based method for verifying properties of a circuit model of a digital circuit design comprising the steps of:

receiving one or more verification requirements for the circuit model;

identifying a first environmental constraint for one or more primary inputs; and automatically determining a first cost-of-analysis value representing an estimate of a cost of the analysis for the design, without performing a complete circuit model analysis, using said first environmental constraint having the steps of:

identifying a first portion of logic in the circuit model that is not necessary to analyze due to the first environmental constraint; and determining a first cost value representing an estimate of computational savings resulting from not analyzing said first portion of logic.

29. The method of claim 28, further comprising the step of presenting said first cost-of-analysis value to a user.

30. The method of claim 28, further comprising the steps of:

identifying a second environmental constraint for a primary input that invalidates a first counterexample; and automatically determining a second cost-of-analysis value representing an estimate of a cost of the analysis for the design, without performing a complete circuit model analysis, using said second environmental constraint.

31. The method of claim 28, further comprising the step of:
  presenting said first and second cost-of-analysis values to a user.

32. The method of claim 31, further comprising the step of:
  comparing said first and second cost-of-analysis values to identify the cost-of-analysis value having a lower cost.

33. A computer based method for verifying properties of a circuit model of a digital circuit design comprising the steps of:
  receiving one or more verification requirements for the circuit model;
  receiving a verification result from a formal analysis of a first portion of the design;
  receiving a second portion of the design that is a subset of said first portion of the design; and
  automatically determining a first cost-of-analysis value representing an estimate of a computational savings resulting from not analyzing said second portion of the design, without performing a complete circuit model analysis of said first portion of the design without said second portion of the design.

34. The method of claim 33, further comprising the step of presenting said first cost-of-analysis value to a user.

35. The method of claim 33, further comprising the steps of:
  receiving a third portion of the design that is a subset of the first portion; and
  automatically determining a second cost-of-analysis value representing an estimate of the computational savings resulting from not analyzing said third portion of the design, without performing a complete circuit model analysis of said first portion of the design without said third portion of the design.

36. The method of claim 35, further comprising the step of:
  presenting said first and second cost-of-analysis values to a user.

37. The method of claim 36, further comprising the step of:
  comparing said first and second cost-of-analysis values to identify the cost-of-analysis value having a lower cost.

38. A computer based system for verifying properties of a circuit model of a digital circuit design comprising:
  verification requirements receiving means for receiving one or more verification requirements for the circuit model;
  counterexample receiving means for receiving one or more counterexamples, including a first counterexample, that does not satisfy one or more of said verification requirements for the circuit model;
  first environmental constraint identification means for identifying a first environmental constraint for one or more primary inputs that invalidates said first counterexample; and
  first cost of analysis means for automatically determining a first cost-of-analysis value representing an estimate of a cost of the analysis for the design, without performing a complete circuit model analysis, using said first environmental constraint, wherein said the first cost of analysis means comprises:
    first logic identification means for identifying a first portion of logic in the circuit model that is not necessary to analyze due to the first environmental constraint; and
    first cost value means for determining a first cost value representing an estimate of computational savings resulting from not analyzing said first portion of logic.

39. The system of claim 38, further comprising:
  presentation means for presenting said first cost-of-analysis value to a user.

40. The system of claim 38, wherein the circuit model is a register transfer level (RTL) design model.

41. The system of claim 38, wherein said first cost value means comprises:
  BDD means for identifying a size of a binary decision diagram (BDD) corresponding to said first portion of logic to estimate said first cost-of-analysis value.

42. The system of claim 38, wherein said counterexample receiving means comprises:
  analysis means for analyzing the circuit design to identify said first counterexample that does not satisfy one or more of said verification requirements for the circuit model.

43. The system of claim 38, further comprising:
  second environmental constraint identification means for identifying a second environmental constraint for a primary input that invalidates said first counterexample; and
  second cost of analysis means for automatically determining a second cost-of-analysis value representing an estimate of a cost of the analysis for the design, without performing a complete circuit model analysis, using said second environmental constraint.

44. The system of claim 43, further comprising:
  presentation means for presenting said first and second cost-of-analysis values to a user.

45. The system of claim 43, further comprising:
  cost-of-analysis comparison means for comparing said first and second cost-of-analysis values to identify the cost-of-analysis value having a lower cost.

46. A computer based system for verifying properties of a circuit model of a digital circuit design comprising:
  verification requirements receiving means for receiving one or more verification requirements for the circuit model; and
  tuning means for determining a first cost-of-analysis value for tuning the analysis of the design, representing an estimate of a cost of the analysis for the design, without performing a complete circuit model analysis, having the steps of
  receiving means for receiving a first signal in the circuit model
  first logic identification means for identifying a first portion of logic in the circuit model that drives the said first signal; and
  first cost value determining means for determining a first cost value representing an estimate of computational savings resulting from not analyzing said first portion of logic.

47. The system of claim 46, wherein said tuning means further comprises:
  second logic identification means for receiving a second portion of logic in the circuit model to drive the first signal; and
  second cost value determining means for determining a second cost value representing an estimate of a computational cost resulting from analyzing said second portion of logic wherein said first cost-of-analysis value is equal to a combination of said first and second cost values.

48. The system of claim 46, further comprising:
presentation means for presenting said first cost-of-analysis value to a user.

49. The system of claim 46, wherein the circuit model is a register transfer level (RTL) design model.

50. The system of claim 46, wherein said first cost value means includes:
BDD means for identifying a size of a binary decision diagram (BDD) corresponding to said first portion of logic to estimate said first cost-of-analysis value.

51. A computer based system for verifying properties of a circuit model of a digital circuit design comprising:
verification requirements receiving means for receiving one or more verification requirements for the circuit model;
counterexample receiving means for receiving one or more counterexamples including a first counterexample, that does not satisfy one or more of said verification requirements for the circuit model, said counterexample from an analysis using an analysis region having boundary net signals;
first portion of logic receiving means for receiving a first portion of logic in the circuit model that was not previously analyzed, and drives one or more of said boundary net signals;
first cost-of-analysis means for automatically determining a first cost-of-analysis value representing an estimate of a cost of the analysis for the design, without performing a complete circuit model analysis, wherein said first cost of analysis means comprises:
first cost value means for determining a first cost value representing an estimate of a cost of an analysis of said first portion of logic.

52. The system of claim 51, further comprising:
second portion of logic receiving means for receiving a second portion of logic in the circuit model that was not previously analyzed, and drives one or more of said boundary net signals that invalidates said first counterexample; and
second cost of analysis means for automatically determining a second cost-of-analysis value representing an estimate of a cost of the analysis for the design, without performing a complete circuit model analysis, using said second environmental constraint.

53. The system of claim 52, further comprising:
presentation means for presenting said first and second cost-of-analysis values to a user.

54. The system of claim 52, further comprising:
cost-of-analysis comparison means for comparing said first and second cost-of-analysis values to identify the cost-of-analysis value having a lower cost.

55. A computer based system for verifying properties of a circuit model of a digital circuit design comprising:
verification requirements receiving means for receiving one or more verification requirements for the circuit model;
counterexample receiving means for receiving one or more counterexamples, including a first counterexample, that does not satisfy one or more of said verification requirements for the circuit model;
first environmental constraint identification means for identifying a first environmental constraint for one or more primary input signals; and
first cost of analysis means for automatically determining a first cost-of-analysis value representing an estimate of a cost of the analysis for the design, without performing a complete circuit model analysis, using said first environmental constraint wherein said first cost of analysis means comprises:
first logic identification means for identifying a first portion of logic in the circuit model that is not necessary to analyze due to the first environmental constraint; and
first cost value means for determining a first cost value representing an estimate of computational savings resulting from not analyzing said first portion logic.

56. The system of claim 55, further comprising:
second environmental constraint identification means for identifying a second environmental constraint for one or more primary inputs; and
second cost of analysis means for automatically determining a second cost-of-analysis value representing an estimate of a cost of the analysis for the design, without performing a complete circuit model analysis, using said second environmental constraint.

57. The system of claim 56, further comprising:
presentation means for presenting said first and second cost-of-analysis values to a user.

58. The system of claim 56, further comprising:
cost-of-analysis comparison means for comparing said first and second cost-of-analysis values to identify the cost-of-analysis value having a lower cost.

59. A computer based system for verifying properties of a circuit model of a digital circuit design comprising:
verification requirements receiving means for receiving one or more verification requirements for the circuit model;
counterexample receiving means for receiving one or more counterexamples, including a first counterexample, that does not satisfy one or more of said verification requirements for the circuit model;
first environmental constraint identification means for identifying a first environmental constraint for one or more boundary net signals; and
first cost of analysis means for automatically determining a first cost-of-analysis value representing an estimate of a cost of the analysis for the design, without performing a complete circuit model analysis, using said first environmental constraint wherein said first cost of analysis means comprises:
first logic identification means for identifying a first portion of logic in the circuit model that is not necessary to analyze due to the first environmental constraint; and
first cost value means for determining a first cost value representing an estimate of computational savings resulting from not analyzing said first portion of logic.

60. The system of claim 59, further comprising:
second environmental constraint identification means for identifying a second environmental constraint for one or more boundary net signals; and
second cost of analysis means for automatically determining a second cost-of-analysis value representing an estimate of a cost of the analysis for the design, without performing a complete circuit model analysis, using said second environmental constraint.

61. The system of claim 60, further comprising:
presentation means for presenting said first and second cost-of-analysis values to a user.

62. The system of claim 60, further comprising:
cost-of-analysis comparison means for comparing said first and second cost-of-analysis values to identify the cost-of-analysis value having a lower cost.

63. A computer based system for verifying properties of a circuit model of a digital circuit design comprising:
verification requirements receiving means for receiving one or more verification requirements for the circuit model;
counterexample means for receiving one or more counterexamples, including a first counterexample, that does not satisfy one or more of said verification requirements for the circuit model;
first environmental constraint means for identifying a first environmental constraint for one or more primary inputs that invalidates said first counterexample; and
first cost-of-analysis means for automatically determining a first cost-of-analysis value representing an estimate of a cost of the analysis for the design, without performing a complete circuit model analysis, using said first environmental constraint including:
first portion of logic means for identifying a first portion of logic that constrains one or more primary inputs according to said first environmental constraint; and
first portion of logic cost means for determining a first cost value for said first portion of logic representing an estimate of a computational cost resulting from analyzing said first portion of logic.

64. The system of claim 63, further comprising presentation means for presenting said first cost-of-analysis value to a user.

65. The system of claim 63, wherein said first portion of logic cost means comprises BDD means for identifying a size of a binary decision diagram (BDD) corresponding to said first portion of logic to estimate said first cost-of-analysis value.

66. The system of claim 63, wherein said one or more counterexamples includes a second counterexample, said system further comprising:
second environmental constraint means for identifying a second environmental constraint that invalidates said second counterexample; and
second cost-of-analysis means for automatically determining a second cost-of-analysis value representing an estimate of a cost of the analysis for the design without performing a complete design analysis and using said second environmental constraint.

* * * * *